United States Patent
Kim et al.

(10) Patent No.: US 10,700,712 B2
(45) Date of Patent: Jun. 30, 2020

(54) SEMICONDUCTOR DEVICE INCLUDING ERROR CORRECTION CODE UNIT THAT GENERATES DATA BLOCK MATRIX INCLUDING PLURAL PARITY BLOCKS AND PLURAL DATA BLOCK GROUPS DIAGONALLY ARRANGED, AND METHODS OF OPERATING THE SAME

(71) Applicant: SK hynix Inc., Icheon (KR)

(72) Inventors: Dae Sung Kim, Icheon (KR); Chol Su Chae, Yongin (KR)

(73) Assignee: SK hynix Inc., Icheon (KR)

( * ) Notice: Subject to any disclaimer, the term of this patent is extended or adjusted under 35 U.S.C. 154(b) by 156 days.

(21) Appl. No.: 15/975,601

(22) Filed: May 9, 2018

(65) Prior Publication Data

US 2019/0103884 A1    Apr. 4, 2019

(30) Foreign Application Priority Data

Oct. 2, 2017    (KR) .................... 10-2017-0128487

(51) Int. Cl.
*H03M 13/29*     (2006.01)
*H03M 13/09*     (2006.01)
(Continued)

(52) U.S. Cl.
CPC ..... *H03M 13/2915* (2013.01); *H03M 13/098* (2013.01); *H03M 13/2721* (2013.01);
(Continued)

(58) Field of Classification Search
CPC ......... H03M 13/2915; H03M 13/2918; H03M 13/2906; H03M 13/2721; H03M 13/098;
(Continued)

(56) References Cited

U.S. PATENT DOCUMENTS 7,181,676 B2 *  2/2007  Hocevar ............ H03M 13/1114
                                                       714/780
8,739,008 B2 *  5/2014  Liu ...................... H03M 13/116
                                                       341/51
(Continued)

FOREIGN PATENT DOCUMENTS

KR   10-2015-0084560 A    7/2015
KR      10-1644712 B1     8/2016

OTHER PUBLICATIONS

Y. Zhang, C. Wu, J. Li and M. Guo, "PCM: A Parity-Check Matrix Based Approach to Improve Decoding Performance of XOR-based Erasure Codes," 2015 IEEE 34th Symposium on Reliable Distributed Systems (SRDS), Montreal, QC, 2015, pp. 182-191. (Year: 2015).*

(Continued)

*Primary Examiner* — Cynthia Britt

(57) ABSTRACT

A semiconductor device includes a controller and a memory device. The controller includes a processor configured to process a request from an external apparatus, an interface configured to receive the request and data from the external apparatus and an ECC encoder configured to generate, in response to the request, a data block matrix including a plurality of data block groups and a plurality of parity blocks that are generated based on the received data, and to generate encoded data by adding parity information to the data block matrix, the encoded data being transmitted to the memory device.

20 Claims, 17 Drawing Sheets

(51) Int. Cl.
*H03M 13/27* (2006.01)
*H03M 13/15* (2006.01)

(52) U.S. Cl.
CPC ... *H03M 13/2906* (2013.01); *H03M 13/2918* (2013.01); *H03M 13/152* (2013.01); *H03M 13/1515* (2013.01); *H03M 13/2909* (2013.01)

(58) Field of Classification Search
CPC ......... H03M 13/1515; H03M 13/2909; H03M 13/152
See application file for complete search history.

(56) References Cited

U.S. PATENT DOCUMENTS

| | | | |
|---|---|---|---|
| 8,972,833 B1 * | 3/2015 | Rahul | H03M 13/098 714/785 |
| 2015/0331741 A1 * | 11/2015 | Park | G06F 11/1004 714/768 |
| 2016/0217030 A1 * | 7/2016 | Shin | G06F 11/085 |
| 2017/0272101 A1 * | 9/2017 | Ha | H03M 13/15 |
| 2017/0324430 A1 * | 11/2017 | Han | H03M 13/3746 |

OTHER PUBLICATIONS

P. Reviriego, M. Demirci, A. Evans and J. A. Maestro, "A Method to Design Single Error Correction Codes With Fast Decoding for a Subset of Critical Bits," in IEEE Transactions on Circuits and Systems II: Express Briefs, vol. 63, No. 2, pp. 171-175, Feb. 2016. (Year: 2016).*

* cited by examiner

FIG.4A

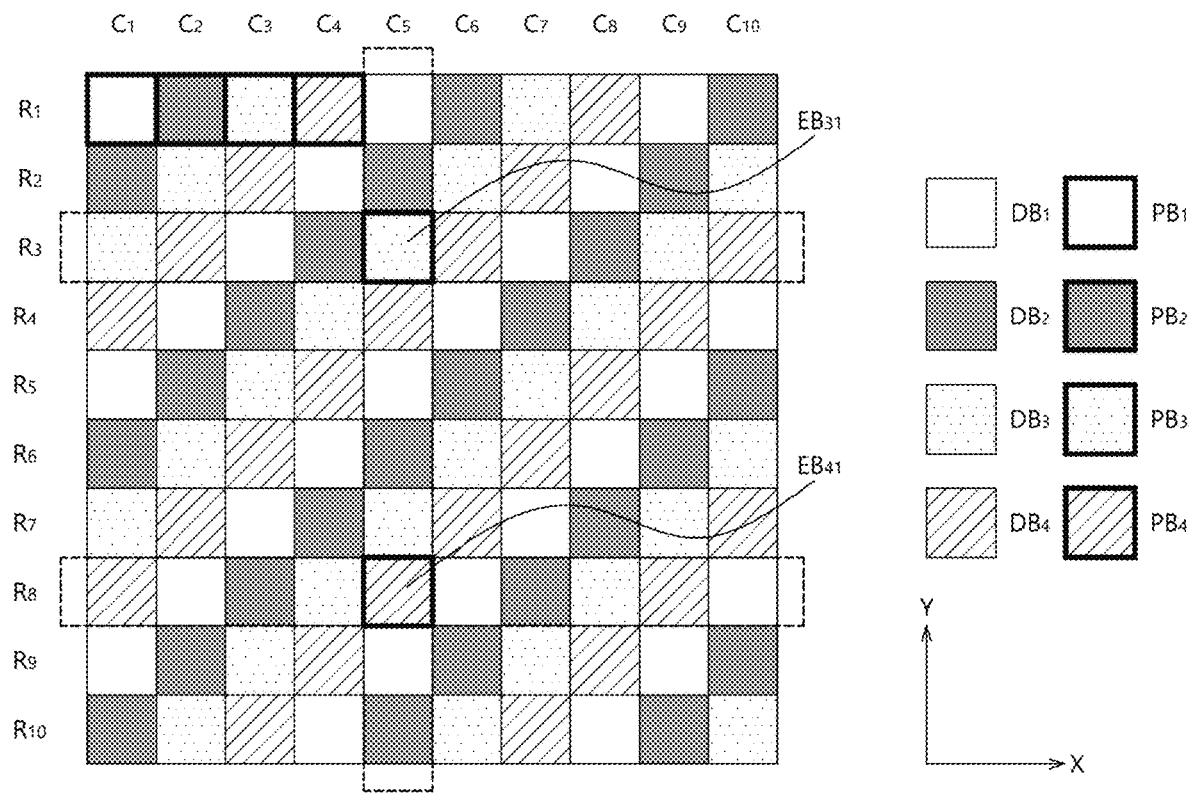

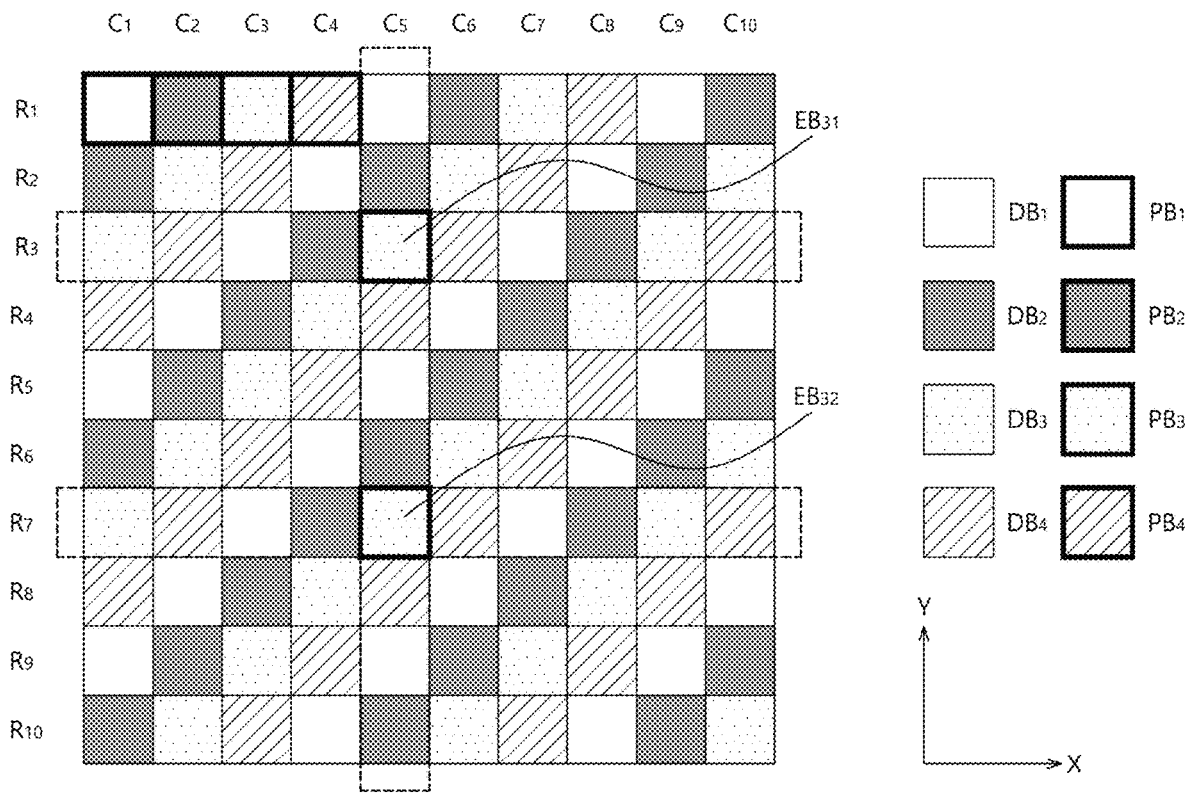

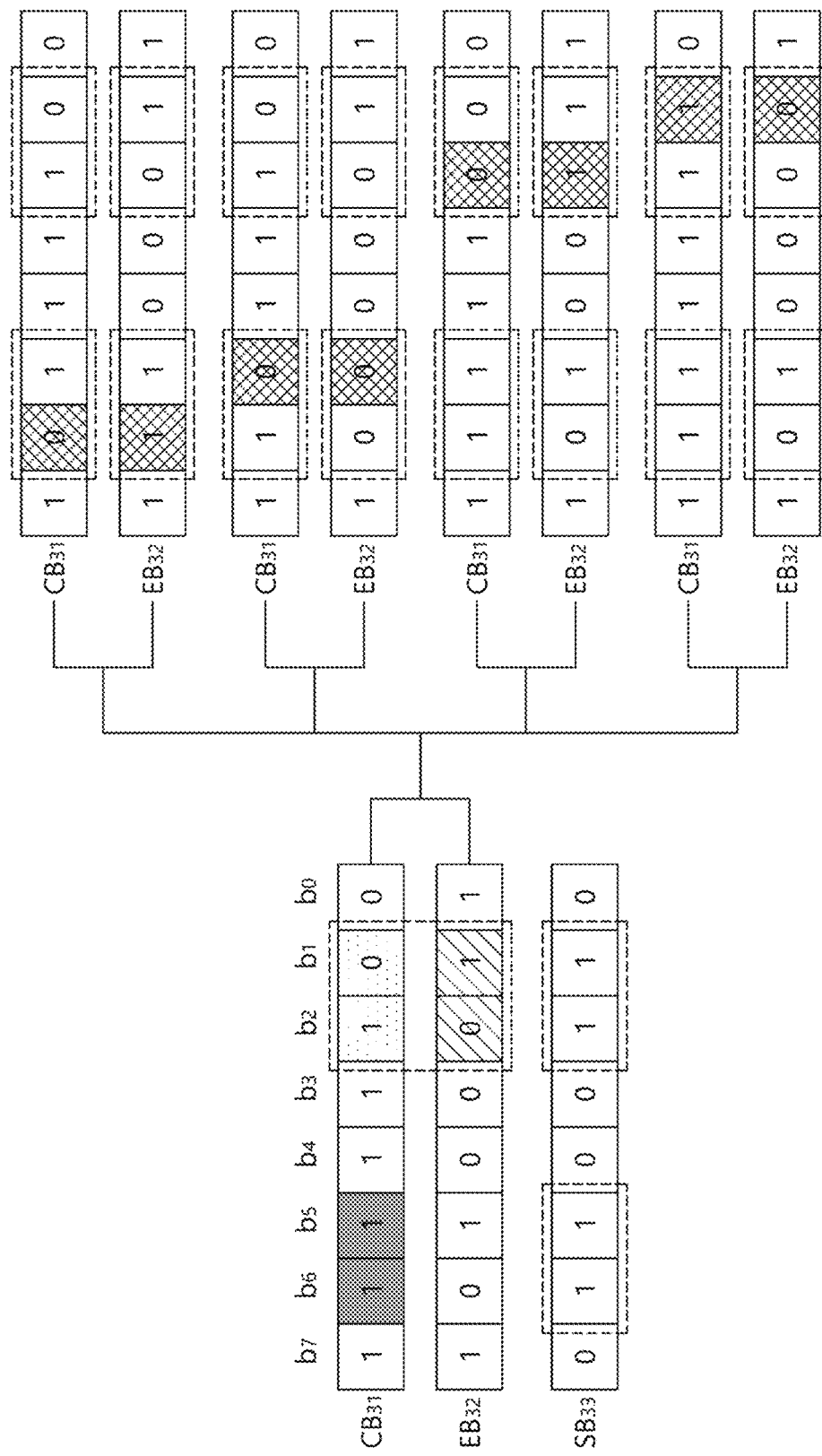

SEMICONDUCTOR DEVICE INCLUDING ERROR CORRECTION CODE UNIT THAT GENERATES DATA BLOCK MATRIX INCLUDING PLURAL PARITY BLOCKS AND PLURAL DATA BLOCK GROUPS DIAGONALLY ARRANGED, AND METHODS OF OPERATING THE SAME

CROSS-REFERENCES TO RELATED APPLICATION

The present application claims priority under 35 U.S.C. § 119(a) to Korean patent application number 10-2017-0128487, filed on Oct. 2, 2017, in the Korean Intellectual Property Office, which is incorporated herein by reference in its entirety.

BACKGROUND

1. Technical Field

Various embodiments of the present disclosure may relate to a semiconductor device, and more particularly, to a semiconductor device including an error correction code (ECC) unit, and an operation method thereof.

2. Related Art

Various block-based concatenated encoding and decoding technologies have been used to detect and correct errors occurring in a semiconductor device. A concatenated Bose-Chaudhuri-Hocquenghem (BCH) code technology is a representative example of a block-based concatenated encoding and decoding technology.

In general, in a semiconductor device storing a plurality of message blocks, which employs a coding technology using a matrix of message blocks with row and column parities for protecting the message blocks, a concatenated BCH code may have a large influence on an error floor of the semiconductor device. In particular, the concatenated BCH code affects the error floor when a particular error pattern stored in the semiconductor device cannot be corrected. That is, a ratio of a number of error bits, i.e., a bit error ratio (BER), of the message blocks cannot decrease below a set level, when a decoding operation performed on a message block including a patterned error (for example, an error pattern), in which a row code and a column code overlap, has failed.

Such an error pattern may be confined to the message block having the error, but it is difficult to determine a bit of the message block at which the error has occurred, i.e., an error bit. Accordingly, it is difficult to specifically target the error bit that needs to be corrected.

In the related art for detecting and correcting errors in data read from a memory device, data stored in a memory region corresponding to a message block is read and verified several times while a threshold value of a memory cell is changed, in order to determine the reliability of individual bits of the message block, and to estimate correct data using a determination result. However, this technique may cause memory cells in the corresponding memory region to deteriorate over time and shorten its lifetime due to multiple read and verify operations.

SUMMARY

Embodiments are directed to a semiconductor device including an error correction code (ECC) unit capable of easily correcting an error pattern, and an operation method thereof.

In an embodiment of the present disclosure, a semiconductor device may include: a controller; and a memory device. The controller may include a processor configured to process a request from an external apparatus, an interface configured to receive the request and data from the external apparatus and an encoder configured to generate, in response to the request, a data block matrix including a plurality of data block groups and a plurality of parity blocks that are generated based on the received data, and to generate encoded data by adding parity information to the data block matrix, the encoded data being transmitted to the memory device.

In an embodiment of the present disclosure, an encoding method of a semiconductor device may include: generating a plurality of data block groups and a plurality of parity blocks corresponding to the data block groups from based on data received from an external apparatus; generating a data block matrix by arranging the data block groups and the parity blocks; and generating encoded data by adding parity information to the data block matrix.

In an embodiment of the present disclosure, a decoding method of a semiconductor device may include: detecting one or more error data blocks in a data block matrix that includes a plurality of data block groups and a plurality of parity blocks by decoding encoded data using parity information included in the encoded data; and correcting error bits in the detected error data blocks using the parity blocks.

These and other features, aspects, and embodiments are described below in the section entitled "DETAILED DESCRIPTION".

BRIEF DESCRIPTION OF THE DRAWINGS

The above and other aspects, features and advantages of the subject matter of the present disclosure will be more clearly understood from the following detailed description taken in conjunction with the accompanying drawings, in which:

FIG. 4A illustrates an arrangement of data blocks and parity blocks according to an embodiment of the present disclosure;

FIG. 8A illustrates a case in which a plurality of error data blocks are detected in different data block groups;

FIGS. 8B and 8C illustrate error bit detection and correction of the error data blocks of FIG. 8A according to embodiments of the present disclosure;

FIG. 9A illustrates a case in which a plurality of error data blocks are detected in the same data block group;

FIGS. 9B to 9D illustrate error bit detection and correction of the error data blocks of FIG. 9A according to an embodiment of the present disclosure;

DETAILED DESCRIPTION

Various embodiments of the present disclosure will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present disclosure is described herein with reference to cross-section and/or plan illustrations of idealized embodiments. However, embodiments of the present disclosure should not be construed as limiting the inventive concept. Although a few embodiments of the present disclosure will be shown and described, it will be appreciated by those of ordinary skill in the art that changes may be made in these embodiments without departing from the principles and spirit of the present invention.

Figure 1:
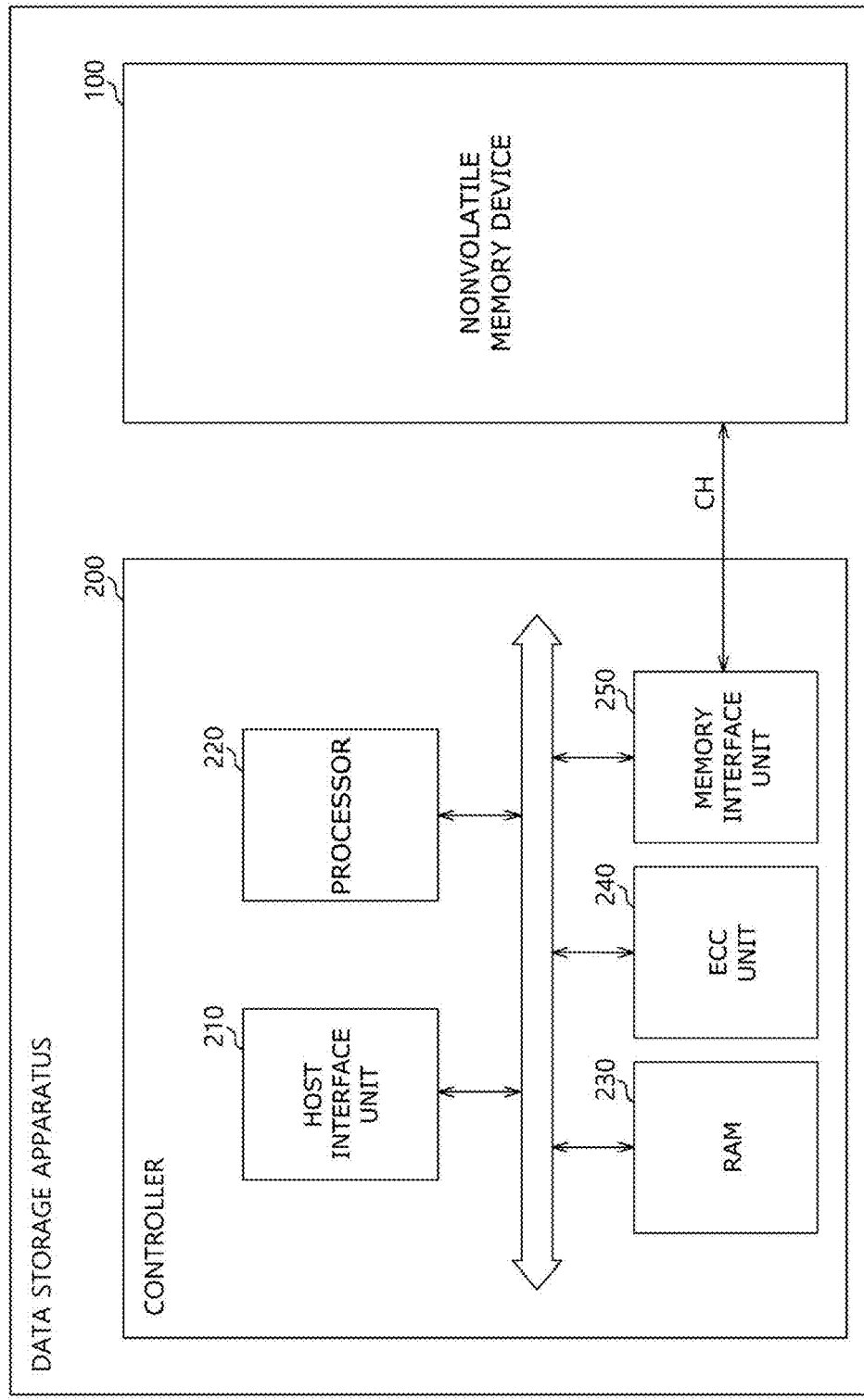
FIG. 1 is a block diagram illustrating a data storage apparatus according to an embodiment of the present disclosure.

FIG. 1 is a block diagram illustrating a data storage apparatus 10 according to an embodiment.

Referring to FIG. 1, the data storage apparatus 10 may store data to be accessed by a host apparatus (not shown) such as a mobile phone, an MP3 player, a laptop computer, a desktop computer, a game player, a television (TV), an in-vehicle infotainment system, or the like. The data storage apparatus 10 may be a semiconductor device or system that includes a storage or memory device. The memory device may be a volatile or non-volatile memory device.

The data storage apparatus 10 may be any of various types of storage apparatuses according to a protocol of an interface coupled to the host apparatus. For example, the data storage apparatus 10 may include any of a solid state drive (SSD); a multimedia card in the form of any of a MultiMediaCard (MMC), an eMMC, a reduced-size MMC (RS-MMC), and a micro-MMC; a secure digital card in the form of any of a secure digital (SD), a mini-SD, and a micro-SD; a universal serial bus (USB) storage device; a universal flash storage (UFS) device; a personal computer memory card international association (PCMCIA) card type storage device; a peripheral component interconnection (PCI) card type storage device; a PCI-express (PCI-E) card type storage device; a compact flash (CF) card; a smart media card; a memory stick; and the like that includes one or more memory chips that are fabricated to store data. Memory chips are typically made of a semiconductor material and may be referred to as semiconductor chips.

The data storage apparatus 10 may be manufactured in any of various types of packages. For example, the data storage apparatus 10 may be manufactured in any of a package on package (POP), a system in package (SIP), a system on chip (SOC), a multi-chip package (MCP), a chip on board (COB), a wafer-level fabricated package (WFP), and a wafer-level stack package (WSP).

The data storage apparatus 10 may include a nonvolatile memory device (e.g., memory chip) 100 and a controller 200.

The nonvolatile memory device 100 may operate as a storage medium of the data storage apparatus 10. The nonvolatile memory device 100 may include any of various types of nonvolatile memory devices such as a NAND flash memory device, a NOR flash memory device, a ferroelectric random access memory (FRAM) device using a ferroelectric capacitor, a magnetic random access memory (MRAM) device using a tunneling magneto-resistive (TMR) layer, a phase-change random access memory (PRAM) device using a chalcogenide alloy, and a resistive random access memory (RERAM) device using a transition metal compound.

For illustrative convenience, FIG. 1 shows a single nonvolatile memory device 100, but the data storage apparatus 10 may include a plurality of nonvolatile memory devices. Embodiments of the present disclosure may be applied to a data storage apparatus including a plurality of nonvolatile memory devices.

The nonvolatile memory device 100 may include a memory cell array (not shown). The memory cell array may include a plurality of memory cells. The plurality of memory cells are respectively disposed in intersection regions between a plurality of bit lines (not shown) and a plurality of word lines (not shown), and are coupled between the plurality of bit lines and the plurality of word lines. The memory cell array may include a plurality of memory blocks, and each of the plurality of memory blocks may include a plurality of pages.

Each of the memory cells in the memory cell array may be a single level cell (SLC) storing a single bit of data, a multilevel cell (MLC) storing 2-bit data, a triple level cell (TLC) storing 3-bit data, or a quad level cell QLC storing 4-bit data. The memory cell array may include a combination of the SLC, the MLC, the TLC, and the QLC. The memory cell array may include memory cells having a two-dimensional (2D) horizontal structure or memory cells having a 3D vertical structure.

The controller 200 may control an overall operation of the data storage apparatus 10 by driving firmware or software loaded into a random access memory (RAM) 230. The controller 200 may decode and drive a code-type instruction or algorithm such as the firmware or software. The controller 200 may be implemented in a hardware form or a combination of hardware and software.

The controller 200 may include a host interface unit 210, a processor 220, the RAM 230, an error correction code (ECC) unit 240, and a memory interface unit 250.

The host interface unit 210 may perform interfacing between a host apparatus (not shown) and the data storage apparatus 10 according to a protocol of the host apparatus. For example, the host interface unit 210 may communicate with the host apparatus according to any one of a USB protocol, a UFS protocol, an MMC protocol, a parallel advanced technology attachment (PATA) protocol, a serial advanced technology attachment (SATA) protocol, a small computer system interface (SCSI) protocol, a serial attached SCSI (SAS) protocol, a PCI protocol, and a PCI-E protocol.

The processor 220 may include a micro control unit (MCU), a central processing unit (CPU), or the like that has been manufactured to execute codes. The processor 220 may process a request transmitted from the host apparatus. To process the request transmitted from the host apparatus, the processor 220 may drive a code-type instruction or algorithm loaded into the RAM 230, for example, firmware and control internal function blocks, to control the host interface unit 210, the RAM 230, the ECC unit 240, the memory interface unit 250, and the nonvolatile memory device 100.

The processor 220 may generate control signals for controlling an operation of the nonvolatile memory device 100 based on requests transmitted from the host apparatus and provide the generated control signals to the memory interface unit 250.

The RAM 230 may include a random access memory such as a dynamic RAM (DRAM) or a static RAM (SRAM). The RAM 230 may store the firmware driven through the processor 220. The RAM 230 may further store data required for driving the firmware, for example, meta data. For example, the RAM 230 may operate as a working memory of the processor 220.

The RAM 230 may temporarily store program data to be transmitted to the nonvolatile memory device 100 from the host apparatus and temporarily store read data to be transmitted to the host apparatus from the nonvolatile memory device 100. For example, the RAM 230 may further operate as a buffer memory.

The ECC unit 240 may perform an ECC encoding operation which generates parity information of data, e.g., program data, to be transmitted to the nonvolatile memory device 100 from the host apparatus. The ECC unit 240 may perform an ECC decoding operation which detects and corrects an error in data, e.g., read data, read from the nonvolatile memory device 100 based on parity information corresponding to the read data.

The memory interface unit 250 may interface between the controller 200 and the nonvolatile memory device 100. The control signals for controlling the operation of the nonvolatile memory device 100 are transmitted to the nonvolatile memory device 100 through the memory interface unit 250. The control signals may include a command, an address, and the like for controlling the nonvolatile memory device 100.

The memory interface unit 250 may control the nonvolatile memory device 100 according to control of the processor 220. At this time, the memory interface unit 250 may be referred to as a "memory control unit." The memory control unit 250 may further provide the ECC-encoded data encoded by the ECC unit 240 to the nonvolatile memory device 100, or may receive the ECC-encoded data from the nonvolatile memory device 100 and provide the received ECC-encoded data to the ECC unit 240.

Figure 2:
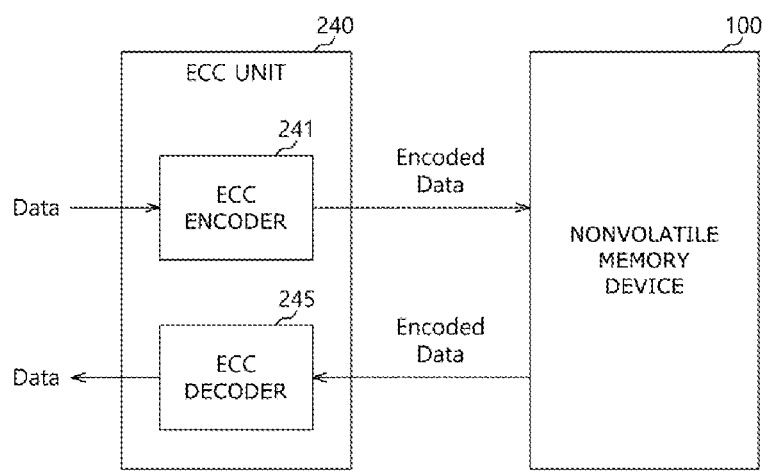
FIG. 2 is a block diagram illustrating an ECC unit of FIG. 1 according to an embodiment of the present disclosure.

FIG. 2 is a block diagram illustrating the ECC unit 240 of FIG. 1 according to an embodiment. The ECC unit 240 may include an ECC encoder 241 and an ECC decoder 245.

The ECC encoder 241 may generate parity information by ECC encoding data "Data" received from the host apparatus and provide encoded data "Encoded Data" including the data "Data" and the parity information to the nonvolatile memory device 100 through, e.g., the memory interface unit 250 of FIG. 1.

The ECC decoder 245 may detect and correct, using the parity information, an error included in encoded data "Encoded Data" read from the nonvolatile memory device 100 in response to a read request of the host apparatus, the parity information being included in the encoded data "Encoded Data". For example, the ECC decoder 245 may correct the detected error when the number of detected error bits is equal to or smaller than a preset number of bits. The preset number of bits may correspond to the error correction capability of the ECC decoder 245. The ECC decoder 245 may provide error-corrected data "Data" to the host apparatus through, e.g., the host interface unit 210 of FIG. 1.

Figure 3:
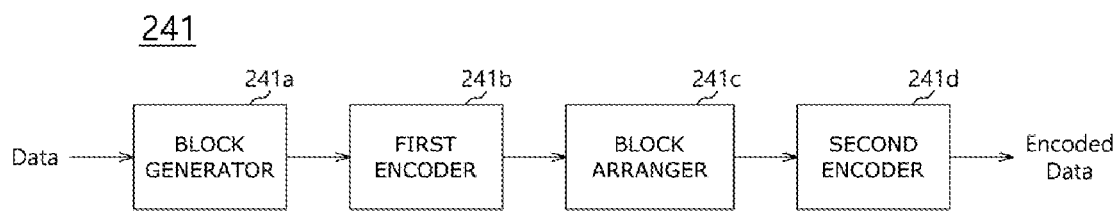
FIG. 3 is a block diagram illustrating an ECC encoder of FIG. 2 according to an embodiment of the present disclosure.
Figure 4A:
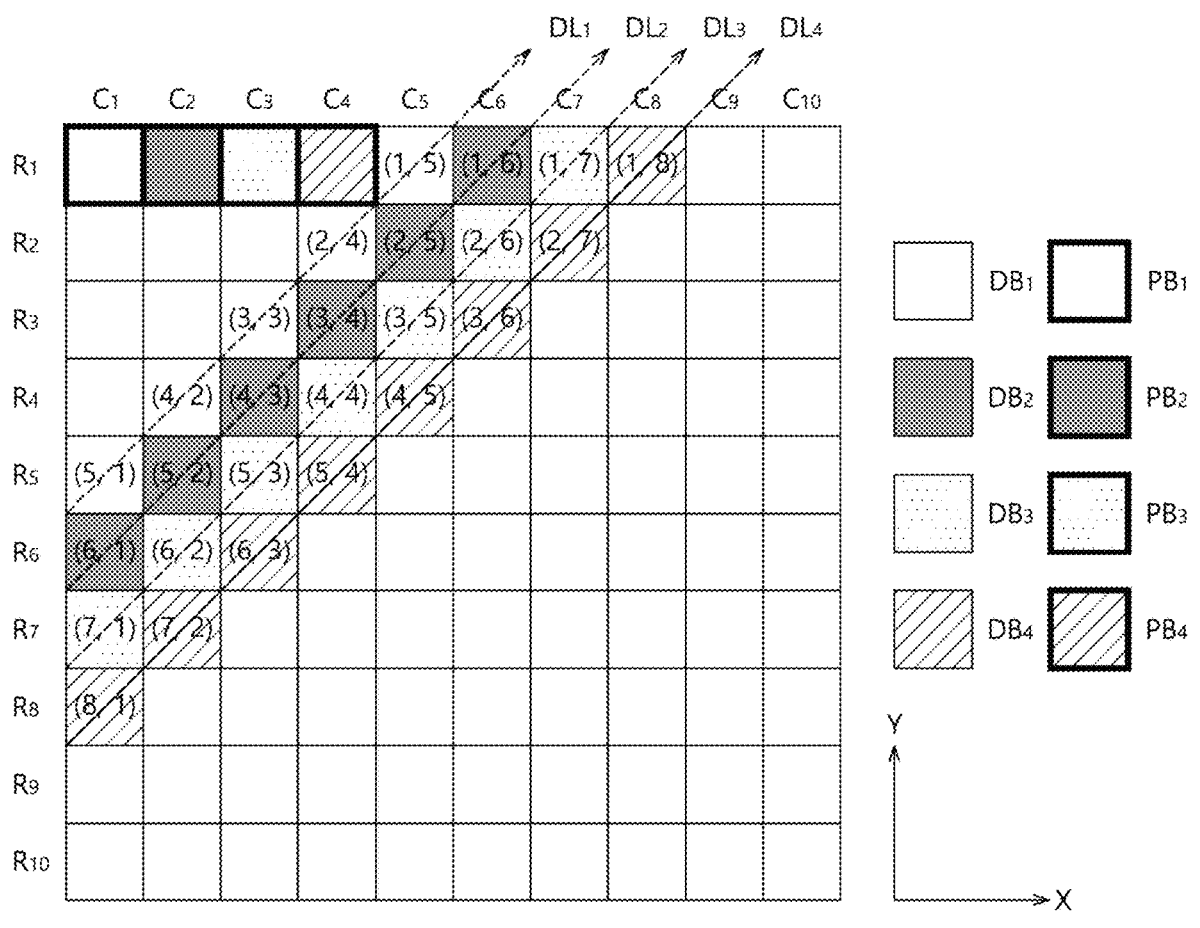
Figure 4B:
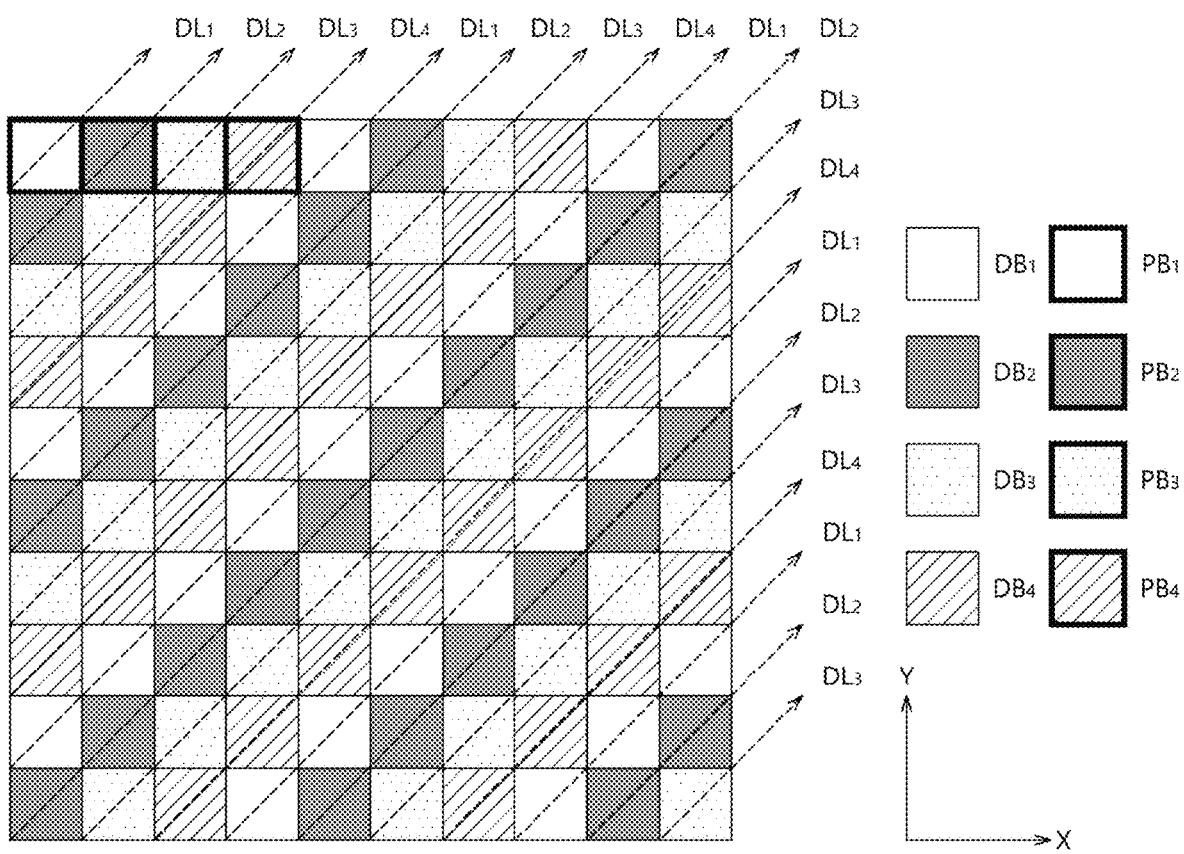
FIG. 4B illustrates a data block matrix according to an embodiment of the present disclosure.
Figure 4C:
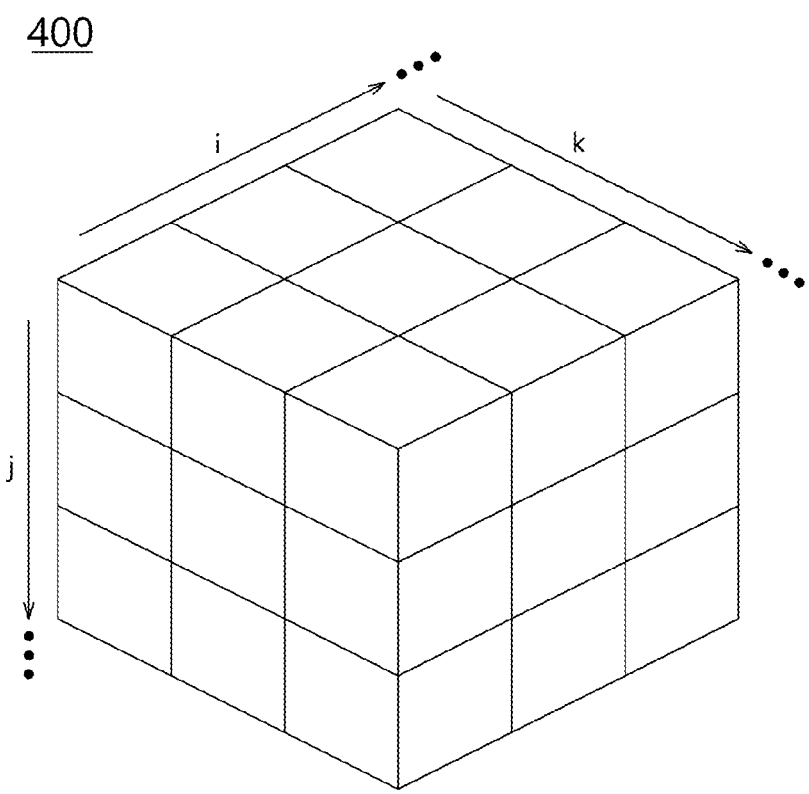
FIG. 4C illustrates data blocks and parity blocks that are arranged in a three-dimensional (3D) manner according to an embodiment of the present disclosure.
Figure 5:
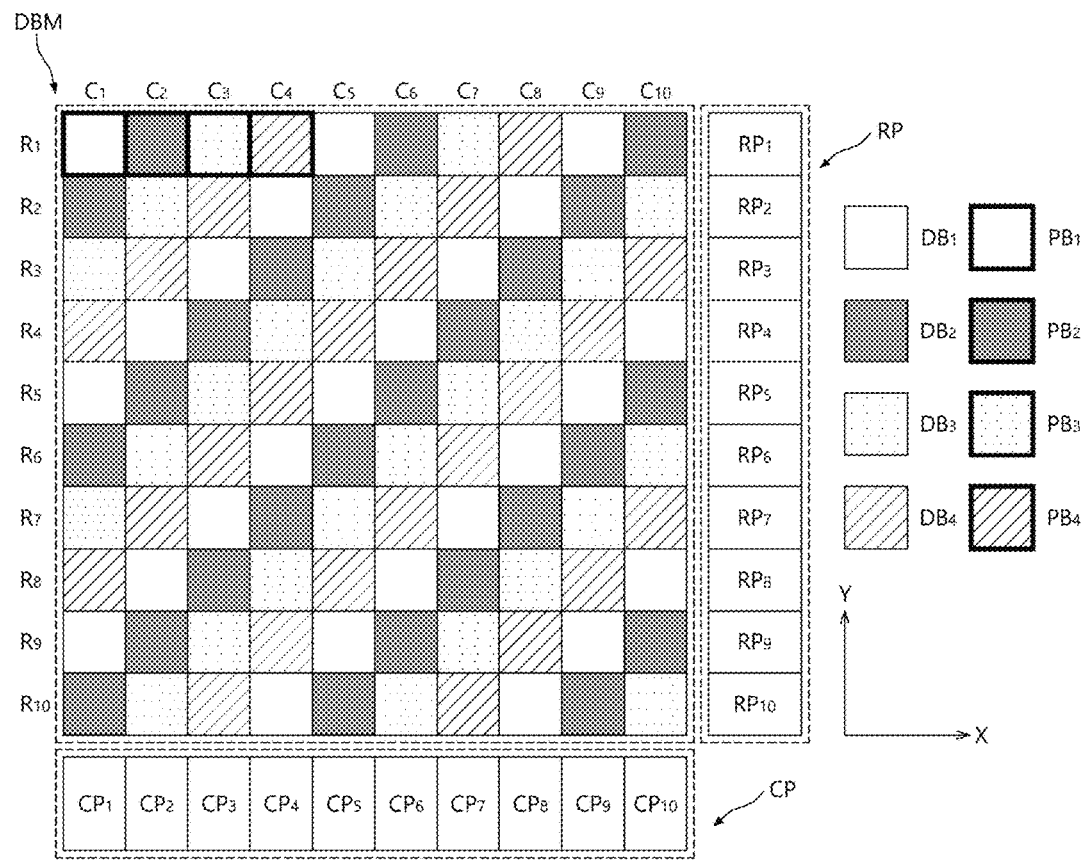
FIG. 5 illustrates encoded data generated by a second encoder of FIG. 3 according to an embodiment of the present disclosure.

FIG. 3 is a block diagram illustrating the ECC encoder 241 of FIG. 2 according to an embodiment. FIG. 4A illustrates an arrangement of data blocks and parity blocks, FIG. 4B illustrates a data block matrix, and FIG. 4C illustrates data blocks and parity blocks that are arranged in a three-dimensional structure. FIG. 5 illustrates encoded data Encoded Data generated by a second encoder 241d of the ECC encoder 241 shown in FIG. 3 according to an embodiment.

Referring to FIG. 3, the ECC encoder 241 may include a block generator 241a, a first encoder 241b, a block arranger 241c, and the second encoder 241d. The data "Data" received from the host apparatus may include a plurality of consecutive bits. The data "Data" including the plurality of consecutive bits may be referred to as a 'message.'

The block generator 241a may generate a plurality of data block groups based on the data "Data" received from the host apparatus.

In particular, the block generator 241a may generate data blocks DBs including a fixed number of bits from the data "Data" received from the host apparatus and group the generated data blocks DBs into a preset number of groups. The data blocks DBs may not overlap each other. That is, none of the data blocks DBs share any bit with another one of the data blocks DBs. The block generator 241a may group the data blocks DBs to generate the preset number of data block groups DBGs corresponding to the preset number of parity blocks PBs. For example, when the preset number of parity blocks is four, the block generator 241a may group the data blocks DBs into four data block groups. The data block groups may not overlap each other. That is, none of the data block groups share a data block with any other data block group.

Hereinafter, for illustrative convenience, it is assumed that the plurality of data block groups may include four data block groups, e.g., a first data block group $DBG_1$ to a fourth data block group $DBG_4$.

The first to fourth data block groups $DBG_1$ to $DBG_4$ may include a plurality of data blocks, e.g., $DB_1$ to $DB_4$ of FIG. 4A, respectively. Hereinafter, the data block $DB_1$ may be referred to as a 'first data block,' the data block $DB_2$ may be referred to as a 'second data block,' the data block $DB_3$ may be referred to as a 'third data block,' and the data block $DB_4$ may be referred to as 'a fourth data block.' Each of the first to fourth data blocks $DB_1$ to $DB_4$ may include one or more bits.

The first data block group $DBG_1$ may include a plurality of first data blocks $DB_1$. The second data block group $DBG_2$ may include a plurality of second data blocks $DB_2$. The third data block group $DBG_3$ may include a plurality of third data blocks $DB_3$. The fourth data block group $DBG_4$ may include a plurality of fourth data blocks $DB_4$.

The block generator 241a may provide the first to fourth data block groups $DBG_1$ to $DBG_4$ to the first encoder 241b. In an embodiment, the block generator 241a may provide the first to fourth data blocks $DB_1$ to $DB_4$ included in the first to fourth data block groups $DBG_1$ to $DBG_4$ to the first encoder 241b in groups. In another embodiment, the block generator 241a may provide the first to fourth data blocks $DB_1$ to $DB_4$ included in the first to fourth data block groups $DBG_1$ to $DBG_4$ to the first encoder 241b in a random manner.

The first encoder 241b may generate first parity information including first to fourth parity blocks, e.g., $PB_1$ to $PB_4$ of FIG. 4A, corresponding to the first to fourth data block groups $DBG_1$ to $DBG_4$, respectively, which are provided from the block generator 241a. Each of the first to fourth parity blocks $PB_1$ to $PB_4$ may be a single parity check (SPC) block. Each of the first to fourth parity blocks $PB_1$ to $PB_4$ may include the same number of bits as the number of bits included in one data block DB. For example, when the first to fourth data blocks $DB_1$ to $DB_4$ may each include the same number of bits, for example, n (n being a natural number), each of the first to fourth parity blocks $PB_1$ to $PB_4$ may include n bits.

When the first to fourth data blocks $DB_1$ to $DB_4$ include different numbers of bits, the first to fourth parity blocks $PB_1$ to $PB_4$ may include the same number of bits as the number of bits of a data block having the largest number of bits among the data blocks in the first to fourth data block groups $DBG_1$ to $DBG_4$ including the first to fourth data blocks $DB_1$ to $DB_4$.

For example, when the first data block group $DBG_1$ includes four first data blocks $DB_1$, the four first data blocks $DB_1$ include different numbers of bits, e.g., a1 bits, b1 bits, c1 bits, and d1 bits, respectively, and a1 is the largest number among a1, b1, c1, and d1, the first parity block $PB_1$ corresponding to the first data block group $DBG_1$ may include a1 bits.

Similarly, when the second data block group $DBG_2$ includes four second data blocks $DB_2$, the four second data blocks $DB_2$ include different numbers of bits, e.g., a2 bits, b2 bits, c2 bits, and d2 bits, respectively, and a2 is the largest number among a2, b2, c2, and d2, the second parity block $PB_2$ corresponding to the second data block group $DBG_2$ may include a2 bits. Each of the third and fourth parity blocks $PB_3$ and $PB_4$ corresponding to the third and fourth data block groups $DBG_3$ and $DBG_4$, respectively, may be determined in the same manner as the first and second parity blocks $PB_1$ and $PB_2$.

Although FIG. 3 illustrates the ECC encoder 241 including one first encoder 241b, embodiments are not limited thereto. For example, the ECC encoder 241 may include a plurality of first encoders 241b corresponding to the number of data block groups. In such a case, the block generator 241a may provide data blocks of each of the data block groups to a corresponding one of the first encoders 241b.

The first encoder 241b may generate the first parity block $PB_1$ by performing an XOR operation on each of the plurality of first data blocks $DB_1$ included in the first data block group $DBG_1$. Similarly, the first encoder 241b may generate the second to fourth parity blocks $PB_2$ to $PB_4$, which respectively correspond to the second to fourth data block groups $DBG_2$ to $DBG_4$.

For example, the first encoder 241b may generate the parity blocks that respectively correspond to the data block groups. When a parity block includes X bits, an $n^{th}$ bit ($0 \leq n \leq X-1$) of the parity block is determined by performing an XOR operation on respective $n^{th}$ bits of the plurality of data blocks in a data block group corresponding to the parity block. Thus, when an XOR operation is performed on the $n^{th}$ bit of the parity block and the respective $n^{th}$ bits of the plurality of data blocks in the data block group, the XOR operation results become zero (0). In this example, values of bits obtained by performing XOR operations on each bit of each of the first to fourth parity blocks $PB_1$ to $PB_4$ and corresponding bits of the data blocks in the corresponding one of the first to fourth data block groups may be zero (0).

It has been described in the embodiment that the first encoder 241b generates the first to fourth parity blocks $PB_1$ to $PB_4$ using the single parity check (SPC) code, but embodiments are not limited thereto. In another embodiment, the first encoder 241b may generate the parity blocks for the data block groups using any of BCH code, a RS code, and the like.

The first encoder 241b may provide the first to fourth data block groups $DBG_1$ to $DBG_4$ and the first to fourth parity blocks $PB_1$ to $PB_4$ to the block arranger 241c.

The block arranger 241c may generate a data block matrix DBM by arranging the first to fourth data blocks $DB_1$ to $DB_4$ included in the first to fourth data block groups $DBG_1$ to $DBG_4$ and the first to fourth parity blocks $PB_1$ to $PB_4$ provided from the first encoder 241b. For example, the block arranger 241c may arrange the first to fourth data blocks $DB_1$ to $DB_4$ and the first to fourth parity blocks $PB_1$ to $PB_4$ in an M×N matrix form. Here, M and N may be natural numbers. For illustrative convenience, FIG. 4A illustrates a 10×10 matrix configured of 10 rows $R_1$ to $R_{10}$ and 10 columns $C_1$ to $C_{10}$.

For example, when the block arranger 241c generates the data block matrix DBM with a preset number of rows and a preset number of columns (for example, M and N) and a sum of the number of the first to fourth data blocks $DB_1$ to $DB_4$ and the number of the first to fourth parity blocks $PB_1$ to $PB_4$, which are provided from the first encoder 241b, is smaller than M×N, the block arranger 241c may form the M×N matrix by adding zero padding blocks corresponding to a number that is calculated by subtracting the sum of the number of the first to fourth data blocks $DB_1$ to $DB_4$ and the number of the first to fourth parity blocks $PB_1$ to $PB_4$ from M×N. Each zero padding block may be a block filled with bits each having a value of zero (0).

The block arranger 241c may preferentially arrange the first to fourth parity blocks $PB_1$ to $PB_4$ before arranging the data blocks $DB_1$ to $DB_4$ included in the first to fourth data block groups $DBG_1$ to $DBG_4$. The block arranger 241c may sequentially arrange the first to fourth parity blocks $PB_1$ to $PB_4$ in one row or in one column. FIG. 4A shows that the first to fourth parity blocks $PB_1$ to $PB_4$ are sequentially arranged in a first row $R_1$, but the arrangement positions of the first to fourth parity blocks $PB_1$ to $PB_4$ are not limited thereto.

The block arranger 241c may determine a data block, among the data blocks $DB_1$ to $DB_4$, to be arranged in each block position of the M×N matrix using a row number of the block position, a column number of the block position, and the number of parity blocks, and arrange the determined data block in the corresponding block position. For example, the block arranger 241c may determine the data block to be arranged in each block position of the M×N matrix using the following Equation 1.

$$\text{Data block to be arranged} = ((i+j-2) \bmod p) + 1, \quad \text{[Equation 1]}$$

wherein i is the row number, j is the column number, and p is the number of parity blocks, i and j being larger than 0.

For example, in FIG. 4A where the number of parity blocks is 4 (p=4), a data block to be arranged in a block position (1, 5) that corresponds to the first row $R_1$ and the fifth column $C_5$ may be the first data block $DB_1$ determined by Equation 1: ((1+5−2) mod 4)+1=1. Similarly, a data block to be arranged in a block position (1, 6) that corresponds to the first row $R_1$ and the sixth column $C_6$ may be the second data block $DB_2$ determined by Equation 1: ((1+6−2) mod 4)+1=2. A data block to be arranged in a block position (1, 7) that corresponds to the first row $R_1$ and the seventh column $C_7$ may be the third data block $DB_3$ determined by Equation 1: ((1+7−2) mod 4)+1=3. A data block to be arranged in a block position (1, 8) that correspond to the first row $R_1$ and the eighth column $C_8$ may be the fourth data block $DB_4$ determined by Equation 1: ((1+8−2) mod 4)+1=4.

For example, the first to fourth data blocks $DB_1$ to $DB_4$ may be arranged in block positions that have values of 1, 2, 3, and 4, respectively, as determined by Equation 1. As a result, the first to fourth data blocks $DB_1$ to $DB_4$ may be respectively arranged along, e.g., first to fourth diagonal lines $DL_1$ to $DL_4$ of the matrix, as illustrated in FIG. 4A.

That is, when a value obtained from Equation 1 is 1, the first data block $DB_1$ is arranged in a corresponding block position and thus the data blocks $DB_1$ in the first data block group $DBG_1$ are arranged along the first diagonal line $DL_1$; when a value obtained from Equation 1 is 2, the second data block $DB_2$ is arranged in a corresponding block position in the second data block group $DBG_2$ along the second diagonal line $DL_2$; when a value obtained from Equation 1 is 3, the third data block $DB_3$ is arranged in a corresponding block position in the third data block group $DBG_3$ along the third diagonal line $DL_3$; and when a value obtained from Equation 1 is 4, the fourth data block $DB_4$ is arranged in a corresponding block position in the fourth data block group $DBG_4$ along the fourth diagonal line $DL_4$. The first to fourth diagonals $DL_1$ to $DL_4$ may be in parallel to each other without overlapping each other. In an embodiment, the first to fourth diagonals $DL_1$ to $DL_4$ may have a positive slope, as illustrated in FIG. 4A.

A data block matrix DBM, in which all the first to fourth data blocks $DB_1$ to $DB_4$ are arranged, is illustrated in FIG. 4B. The first to fourth diagonals $DL_1$ to $DL_4$ may be sequentially repeatedly arranged along the X-axis direction of the data block matrix DBM.

As illustrated in FIG. 4B, the first data blocks $DB_1$ of the first data block group $DBG_1$ may be arranged along the first diagonal line $DL_1$ from the lower left to the upper right corner of the data block matrix DBM. The second data blocks $DB_2$ of the second data block group $DBG_2$ may be arranged along the second diagonal line $DL_2$ in the same manner as the first data block group $DBG_1$. The third data blocks $DB_3$ of the third data block group $DBG_3$ may be arranged along the third diagonal line $DL_3$ in the same manner as the first data block group $DBG_1$. The fourth data blocks $DB_4$ of the fourth data block group $DBG_4$ may be arranged along the fourth diagonal line $DL_4$ in the same manner as the first data block group $DBG_1$. Accordingly, none of the first data block group $DBG_1$, the second data block group $DBG_2$, the third data block group $DBG_3$, and the fourth data block group $DBG_4$ may be located on the same diagonal line as each other.

In another embodiment, the block arranger 241c may arrange parity blocks and data blocks in a 3-D structure as illustrated in FIG. 4C. FIG. 4C shows that the parity blocks and the data blocks are arranged to form a regular hexahedron structure 400, but the arrangement structure is not limited thereto. As illustrated in FIG. 4C, when the parity blocks and the data blocks are arranged in the 3D regular hexahedron structure 400, the block arranger 241c may determine data blocks to be arranged in block positions in a data block matrix using the following Equation 2, and may arrange the determined data blocks in the corresponding block positions.

$$\text{Data block to be arranged} = ((i+j+k) \bmod p), \quad \text{[Equation 2]}$$

wherein i is a row number of a block position, j is a column number of the block position, k is a matrix number, and p is the number of parity blocks, i, j, k, and p being larger than 0. The matrix number k corresponds to a stacking sequence of a corresponding matrix when a plurality of matrices is stacked to form the 3D regular hexahedron structure.

The block arranger 241c may provide the generated data block matrix DBM to the second encoder 241d.

The second encoder 241d may generate and output encoded data "Encoded Data" as illustrated in FIG. 5 by adding second parity information, which includes a row parity RP and a column parity CP, to the data block matrix DBM provided from the block arranger 241c. The row parity RP and the column parity CP may be used to detect and correct an error in a process of decoding the encoded data "Encoded Data." Various code techniques may be applied to generate the row parity RP and the column parity CP.

Figure 6:
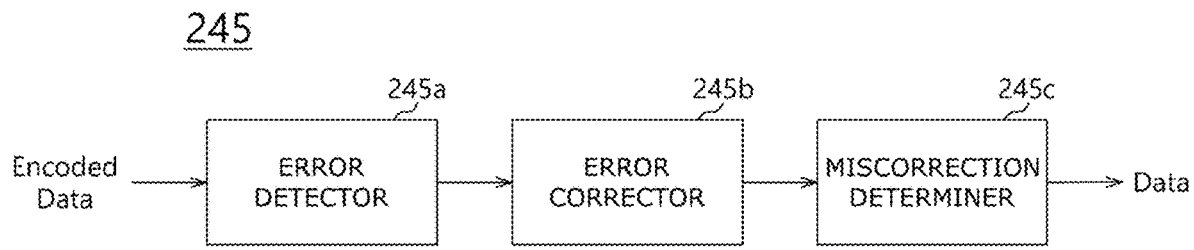
FIG. 6 is a block diagram illustrating an ECC decoder of FIG. 2 according to an embodiment of the present disclosure.

Referring to FIG. 5, when the data block matrix DBM includes the 10 rows $R_1$ to $R_{10}$ and the 10 columns $C_1$ to $C_{10}$, the second encoder 241d may generate a plurality of row parity blocks $RP_1$ to $RP_{10}$ and a plurality of column parity blocks $CP_1$ to $CP_{10}$ by employing a code technique such as any of a BCH code, an RS code, and a Hamming code, and add the generated row parity blocks $RP_1$ to $RP_{10}$ and column parity blocks $CP_1$ to $CP_{10}$ to the rows $R_1$ to $R_{10}$ and columns $C_1$ to $C_{10}$ corresponding thereto. The encoded data "Encoded Data" output from the second encoder 241d may be provided to the nonvolatile memory device 100, as illustrated in FIG. 2, and the nonvolatile memory device 100 may store the encoded data "Encoded Data" in a memory region. FIG. 6 is a block diagram illustrating the ECC decoder 245 of FIG. 2 according to an embodiment.

Referring to FIG. 6, the ECC decoder 245 may include an error detector 245a, an error corrector 245b, and a miscorrection determiner 245c.

The error detector 245a may detect one or more errors in read data, for example, encoded data "Encoded Data" read from the nonvolatile memory device 100 in response to a read request from the host apparatus. For example, the error detector 245a may detect one or more errors present in a data block matrix DBM using second parity information, i.e., a row parity RP and a column parity CP obtained by decoding the encoded data "Encoded Data." The technique of detecting the one or more errors present in the data block matrix DBM using the row parity RP and the column parity CP is known in the related art and thus detailed description thereof is omitted.

The error corrector 245b may determine whether or not the errors detected by the error detector 245a is correctable, and correct the errors when the errors is determined to be correctable. For example, when each of the errors detected by the error detector 245a is a (1, 1) error pattern, the error corrector 245b may correct error bits in a data block corresponding to the detected error pattern (hereinafter, referred to as an "error data block") using a data block group including the error data block and a parity block corresponding to the data block group. The (1, 1) error pattern may be an error pattern occurring when one data block disposed at an intersection position of one row code and one column code is detected as the error data block.

The error corrector 245b may determine the error bits in the error data block and correct the determined error bits. In an embodiment, the error corrector 245b may correct the error bits included in the error data block by generating an XOR block and overwriting the XOR block on the error data block. The XOR block is generated by performing XOR operations on bits of the remaining data blocks, other than the error data block in the data block group, and bits of the parity block. This embodiment will be described in detail with reference to FIG. 7B.

In another embodiment, the error corrector 245b may correct the error bits included in the error data block by generating an XOR block and performing an XOR operation on the error data block and the XOR block. The XOR block is generated by performing XOR operations on bits of all the data blocks in the data block group, including the error data block and bits of the parity block. This embodiment will be described in detail with reference to FIG. 7C.

Hereinafter, an example in which one or more error bits in an error data block is corrected by the error corrector 245b will be described with reference to FIGS. 7A to 7C. For illustrative convenience, it is assumed that a first data block group $DBG_1$ may include two data blocks, e.g., a first data block $DB_{11}$ and a second data block $DB_{12}$.

Figure 7A:
FIG. 7A illustrates a case in which no error data block is present in a data block group.

FIG. 7A shows that the first data block $DB_{11}$ and the second data block $DB_{12}$ of the first data block group $DBG_1$ are not error data blocks, i.e., neither first data block $DB_{11}$ nor the second data block $DB_{12}$ includes the error bits. Therefore, an XOR block $SB_1$ obtained by performing XOR operations on the first data block $DB_{11}$, the second data block $DB_{12}$, and the parity block $PB_1$ may include only bits having a value of zero (0). When performing the XOR operations on the first data block $DB_{11}$, the second data block $DB_{12}$, and the parity block $PB_1$, a first XOR operation is performed on the first and second data blocks $DB_{11}$ and $DB_{12}$, and then a second XOR operation is performed on a result block of the first XOR operation and the parity block $PB_1$.

Figure 7B:
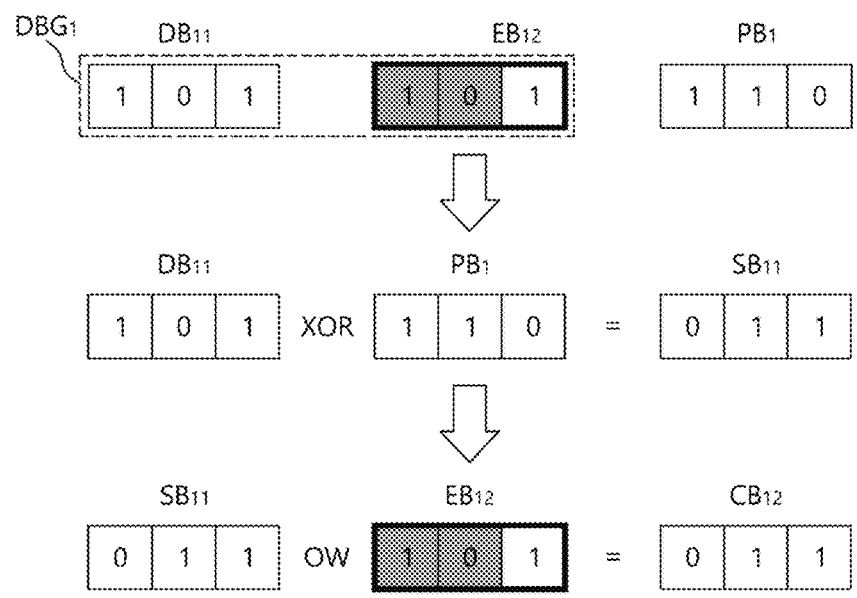
FIGS. 7B and 7C illustrates cases in which an error data block detected in a data block group is corrected using different techniques according to embodiments of the present disclosure.

Referring to FIG. 7B, it is assumed that the second data block $DB_{12}$ of the first data block group $DBG_1$ is an error data block $EB_{12}$ and shaded bits in the second data block $DB_{12}$ are error bits.

The error corrector 245b may generate the XOR block $SB_{11}$ by performing an XOR operation on the remaining data block in the first data block group $DBG_1$, i.e., the first data block $DB_{11}$, and the parity block $PB_1$. The error corrector 245b may correct the error bits in the second data block $EB_{12}$ by overwriting (OW) the XOR block $SB_{11}$ on the second data block $EB_{12}$. The error-corrected second data block $DB_{12}$ may be indicated as a data block $CB_{12}$ in FIG. 7B. It can be seen that the error-corrected second data block $CB_{12}$ is the same as the second data block $DB_{12}$ of FIG. 7A that includes no error.

Figure 7C:
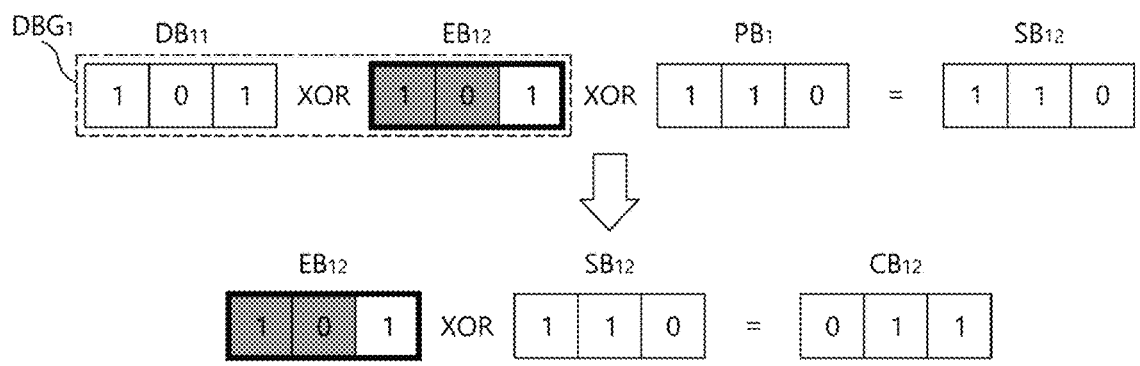

Referring to FIG. 7C, the error corrector 245b may obtain the XOR block $SB_{12}$ by performing XOR operations on all the data blocks, e.g., the first data block $DB_{11}$ and the second data block $EB_{12}$, of the first data block group $DBG_1$ and the parity block $PB_1$. The error corrector 245b may correct the error bits in the second data block $EB_{12}$ by performing an XOR operation on the second data block $EB_{12}$ and the XOR block $SB_{12}$. It can be seen that the error-corrected second data block $CB_{12}$ is the same as the second data block $DB_{12}$ of FIG. 7A.

It can be seen in FIG. 7C that bits of the second data block $EB_{12}$ corresponding to bits having a value of 1 in the XOR block $SB_{12}$ are inverted to correct the second data block $EB_{12}$. In FIG. 7C, the bits in the error data block $EB_{12}$ corresponding to the bits having the value of 1 in the XOR block $SB_{12}$ may be the error bits.

FIG. 8A illustrates a case that a (2, 1) error pattern including different types of data blocks is present in a data block matrix DBM, and FIG. 8B illustrates the (2, 1) error pattern that is corrected by the error corrector 245b according to an embodiment. The (2, 1) error pattern may be an error pattern occurring when two data blocks disposed at two intersection positions between two row codes and one column code are detected as error data blocks. That is, the data block matrix includes two error data blocks disposed on the one column code.

FIG. 8A illustrates an example in which two data blocks disposed at intersection positions between one column $C_5$ and two rows $R_3$ and $R_5$ are detected as error data blocks $EB_{31}$ and $EB_{41}$ and the two error data blocks $EB_{31}$ and $EB_{41}$ are included in different data block groups. For example, the error data block $EB_{31}$ (hereinafter, referred to as a 'first error data block') may be included in the third data block group $DBG_3$ and correspond to the third data block $DB_3$, and the error data block $EB_{41}$ (hereinafter, referred to as a 'second error data block') may be included in the fourth data block group $DBG_4$ and correspond to the fourth data block $DB_4$.

Referring to FIG. 8B, the error corrector 254b may obtain an XOR block $SB_{31}$ by performing XOR operations on all the third data blocks $DB_3$ of the third data block group $DBG_3$ including the first error data block $EB_{31}$ and the third parity block $PB_3$. Positions of bits having the value of 1 in the XOR block $SB_{31}$ may correspond to positions of error bits in the first error data block $EB_{31}$.

The error corrector may correct the error bits in the first error data block $EB_{31}$ by performing an XOR operation on the first error block $EB_{31}$ and the XOR block $SB_{31}$. The error-corrected first data block may be indicated as a data block $CB_{31}$ in FIG. 8B.

Similarly, referring to FIG. 8C, the error corrector 254b may obtain an XOR block $SB_{41}$ by performing XOR operations on all the fourth data blocks $DB_4$ of the fourth data block group $DBG_4$ including the second error data block $EB_{41}$ and the fourth parity block $PB_4$. The error corrector 245b may correct error bits in the second error data block $EB_{41}$ by performing an XOR operation on the second error block $EB_{41}$ and the XOR block $SB_{41}$. The error-corrected second data block may be indicated as a data block $CB_{41}$ in FIG. 8C.

When a plurality of error patterns in the data block matrix DBM are detected and the detected error patterns are included in different data block groups, the error corrector 245b may correct errors of each error data block using the same method as the method of correcting errors when one error pattern is detected using a parity block corresponding to a data block group in which an error data block is detected.

The method of correcting error bits by performing an XOR operation on a first XOR block and an error data block has been described with reference to FIGS. 8B and 8C. Herein, the first XOR block is obtained by performing XOR operations on all data blocks including the error data block and a parity block. However, the error correction method is not limited thereto. As illustrated in FIG. 7B, the error corrector 245b may correct error bits by overwriting a second XOR block on the error data block. Herein, the second XOR block is obtained by performing XOR operations on the remaining data blocks in a data block group other than the error data block and the parity block.

FIG. 9A illustrates a case in which a (2, 1) error pattern including the same type of data blocks is present in a data block matrix DBM, and FIGS. 9B to 9D illustrate an example in which the (2, 1) error pattern is corrected by the error corrector 245b according to an embodiment.

FIG. 9A illustrates an example in which two data blocks disposed at two intersection positions between one column $C_5$ and two rows $R_3$ and $R_7$ are detected as error data blocks $EB_{31}$ and $EB_{32}$ and the two error data blocks $EB_{31}$ and $EB_{32}$ are included in the same data block group. For example, both the first error data blocks $EB_{31}$ and the second error data block $EB_{32}$ may be included in the third data block group $DBG_3$ and correspond to the third data block $DB_3$.

In this example, as illustrated in FIG. 9B, the error corrector 245b may obtain an XOR block $SB_{33}$ by performing XOR operations on all the third data blocks $DB_3$ of the third data block group $DBG_3$ including the first and second error data block $EB_{31}$ and $EB_{32}$ and the third parity blocks $PB_3$. It may be assumed that four bits each having a value of 1, for example, a second bit $b_1$, a third bit $b_2$, a sixth bit $b_5$, and a seventh bit $b_6$, are present in the XOR block $SB_{33}$. The error corrector 245b may determine that a total of four error bits are present in the first error data block $EB_{31}$ and the second error data block $EB_{32}$ with reference to the XOR block $SB_{33}$, but the error corrector 245b may not determine positions of the error bits and the number of error bits included in each of the first error data block $EB_{31}$ and the second error data block $EB_{32}$.

For example, the error corrector 245b according to an embodiment may first perform an XOR operation on the XOR block $SB_{33}$ and any one of the two error data blocks $EB_{31}$ and $EB_{32}$ as illustrated in FIG. 9C. As illustrated in FIG. 9C, the first XOR operation is performed on the first error data block $EB_{31}$ and the XOR block $SB_{33}$, but the first XOR operation may be performed on the second error data block $EB_{32}$ and the XOR block $SB_{33}$.

Referring to FIG. 9C, values of all the second bit $b_1$, the third bit $b_2$, the sixth bit $b_5$, and the seventh bit $b_6$ of the first error data block $EB_{31}$ may be inverted by the first XOR operation, and thus an error-corrected data block $CB_{31}$. (hereinafter, referred to as a 'first correction data block') may be generated.

For example, when it is assumed that the sixth bit $b_5$ and the seventh bit $b_6$ are error bits in the first error data block $EB_{31}$, it may be determined that, in the first correction data block $CB_{31}$, the second bit $b_1$ and the third bit $b_2$ are miscorrected and the sixth bit $b_5$ and the seventh bit $b_6$ are normally corrected. The error corrector 245b may determine that a portion of bits inverted in the first correction data block $CB_{31}$ corresponds to an error bit and the remaining portion may be miscorrected, but the error corrector 245b may not determine that which bit of the inverted bits in the first correction data block $CB_{31}$ corresponds to an error bit and which bit of the inverted bits is miscorrected.

The error corrector 245b may not determine which bit of the second bit $b_1$, the third bit $b_2$, the sixth bit $b_5$, and the seventh bit $b_6$ even in the second error data block $EB_{32}$ is an error bit. For example, when it is assumed that the error bits included in the second error data block $EB_{32}$ are the second bit $b_1$ and the third bit $b_2$, positions of the miscorrected bits $b_1$ and $b_2$ included in the first correction data block $CB_{31}$ may coincide with positions of the error bits $b_1$ and $b_2$ included in the second error data block $EB_{32}$.

As illustrated in FIG. 9D, the error corrector 245b may correct the errors in the first error data block $EB_{31}$ and the second error data block $EB_{32}$ by sequentially inverting bit values corresponding to a value of 1 in the XOR block $SB_{33}$ among the bits of the first correction data block $CB_{31}$ and the bits of the second error data block $EB_{32}$, for example, bit values of the second bit $b_1$, the third bit $b_2$, the sixth bit $b_5$, and the seventh bit $b_6$ of the first correction data block $CB_{31}$ and the second error data block $EB_{32}$, and by decoding the first correction data block $CB_{31}$ and the second error data block $EB_{32}$ in which the bit values are inverted.

For example, the following processes are sequentially performed. The error corrector 245b may invert the bit values of the seventh bits $b_6$ in the first correction data block $CB_{31}$ and the second error data block $EB_{32}$, and may perform decoding on the first correction data block $CB_{31}$ and the second error data block $EB_{32}$, in which the bit values of the seventh bits $b_6$ are inverted. The error corrector 245b may invert the bit values of the sixth bits $b_5$ in the first correction data block $CB_{31}$ and the second error data block $EB_{32}$, and may perform decoding on the first correction data block $CB_{31}$ and the second error data block $EB_{32}$, in which the bit values of the sixth bits $b_5$ are inverted. The error corrector 245b may invert the bit values of the third bits $b_2$ in the first correction data block $CB_{31}$ and the second error data block $EB_{32}$, and may perform decoding on the first correction data block $CB_{31}$ and the second error data block $EB_{32}$, in which the bit values of the third bits $b_2$ are inverted. The error corrector 245b may invert the bit values of the second bits $b_1$ in the first correction data block $CB_{31}$ and the second error data block $EB_{32}$, and may perform decoding on the first correction data block $CB_{31}$ and the second error data block $EB_{32}$, in which the bit values of the second bits $b_1$ are inverted.

Accordingly, the error corrector 245b may perform error correction on the two error data blocks $EB_{31}$ and $EB_{32}$ by performing the decoding only 5 times.

The error corrector 245b may perform first decoding on the first correction data block $CB_{31}$ and the second error data block $EB_{32}$, in which no bits are inverted. When the first decoding has failed, the error corrector 245b may perform second to fifth decoding by sequentially inverting the bit values corresponding to a value of 1 in the XOR block $SB_{33}$ among the bits of the first correction data block $CB_{31}$ and the bits of the second error data block $EB_{32}$, as illustrated in FIG. 9D.

The first decoding may be performed using row parities and a column parity corresponding to row codes and a column code including the first correction data block $CB_{31}$ and the second error data block $EB_{32}$. For example, referring to FIG. 5, the first decoding may include detecting errors contained in a third row code $R_3$ including the first correction data block $CB_{31}$ and correcting the detected errors using a third row parity $RP_3$. Further, the first decoding may include detecting errors contained in a seventh row code $R_7$ including the second error data block $EB_{32}$ and correcting the detected errors using a seventh row parity $RP_7$. Furthermore, the first decoding may include detecting errors contained in a fifth column code $C_5$ including the first correction data block $CB_{31}$ and the second error data block $EB_{32}$ and correcting the detected errors using a fifth column parity $CP_5$. The second decoding to the fifth decoding may be performed in the same manner as the first decoding.

When the decoding of the data block matrix DBM is successful, the error corrector 245b may provide the data block matrix DBM including error-corrected data blocks to the miscorrection determiner 245c.

The miscorrection determiner 245c may determine whether or not miscorrected bits are present in the data block matrix DBM provided from the error corrector 245b. The miscorrection determiner 245c may determine whether or not the miscorrected bits are present in the data block matrix DBM using first to fourth data block groups $DBG_1$ to $DBG_4$ and the first to fourth parity blocks $PB_1$ to $PB_4$ included in the data block matrix DBM from the error corrector 245b. For example, the miscorrection determiner 245c may perform an XOR operation on all data blocks of the first data block group $DBG_1$ and the first parity block $PB_1$, and may determine whether or not all of the XOR-operated values are zero (0). Similarly, the miscorrection determiner 245c may perform XOR operations on all data blocks of the second data block group $DBG_2$ and the second parity block $PB_2$, all data blocks of the third data block group $DBG_3$ and the third parity block $PB_3$, and all data blocks of the fourth data block group $DBG_4$ and the fourth parity block $PB_4$, and may determine whether or not all of the XOR-operated values are zero (0).

When all of the XOR-operated values are zero (0), the miscorrection determiner 245c may determine that miscorrected bits are not present in the data block matrix DBM and conclude that the decoding is successful. When at least one or more values among the XOR-operated values are 1, the miscorrection determiner 245c may determine that the miscorrected bits are present in the data block matrix DBM and conclude that the decoding for the data block matrix DBM has failed.

Figure 10:
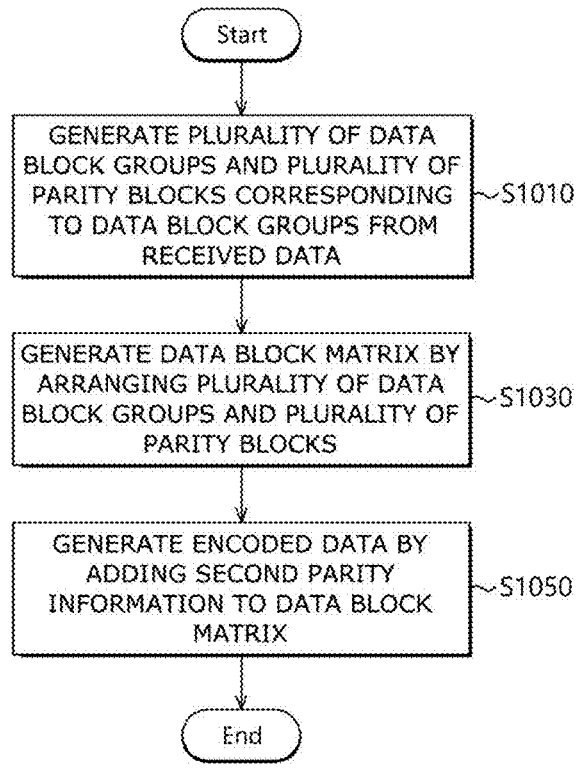
FIG. 10 is a flowchart illustrating an encoding method according to an embodiment of the present disclosure.

FIG. 10 is a flowchart illustrating an encoding method of an error correction code (ECC) unit according to an embodiment. The encoding method according to this embodiment will be described with reference to FIG. 10 together with FIGS. 1 to 5.

At S1010, the ECC encoder (e.g., 241 of FIG. 2) of the ECC unit (e.g., 240 of FIG. 1) may generate a plurality of data block groups (e.g., $DBG_1$ to $DBG_4$) and a plurality of parity blocks (e.g., $PB_1$ to $PB_4$ of FIG. 4A) corresponding to the plurality of data block groups $DBG_1$ to $DBG_4$, respectively, from data "Data" received from an external apparatus, e.g., a host apparatus. For example, the plurality of data block groups $DBG_1$ to $DBG_4$ from the received data "Data" may be generated by the block generator (e.g., 241a of FIG. 3) of the ECC encoder 241. The plurality of data block groups $DBG_1$ to $DBG_4$ may include the plurality of data blocks (e.g., $DB_1$ to $DB_4$ of FIG. 4A), and each of the plurality of data blocks $DB_1$ to $DB_4$ may include one or more bits.

The parity blocks $PB_1$ to $PB_4$ corresponding to the plurality of data block groups $DBG_1$ to $DBG_4$, respectively, may be generated by the first encoder (e.g., 241b of FIG. 3) of the ECC encoder 241. The parity blocks $PB_1$ to $PB_4$ may have bits whose XOR-operated values with bits included in the data blocks $DB_1$ to $DB_4$ of the data block groups $DBG_1$ to $DBG_4$ are zero (0). For example, when a parity block includes X bits, an $n^{th}$ bit ($0 \leq n \leq X-1$) of the parity block is determined by performing an XOR operation on respective $n^{th}$ bits of the plurality of data blocks in a data block group corresponding to the parity block. Thus, when performing an XOR operation on the parity block and the plurality of data blocks in the data block group, all bit values of the XOR resulting block are 0.

At S1030, the ECC encoder 241 of the ECC unit 240 may generate the data block matrix (e.g., DBM of FIG. 4B) by arranging the data block groups $DBG_1$ to $DBG_4$ and the parity blocks $PB_1$ to $PB_4$. The data block matrix DBM may be generated by the block arranger (e.g., 241c of FIG. 3) of the ECC encoder 241. In the data block matrix DBM, the data block groups $DBG_1$ to $DBG_4$ may be arranged along different diagonal lines, and the parity blocks $PB_1$ to $PB_4$ may be arranged along different diagonal lines. The data block matrix DBM may have a structure of M rows and N columns. M and N may be natural numbers. In the data block matrix DBM including M×N blocks, the remaining blocks, which do not correspond to data blocks included in the data block groups $DBG_1$ to $DBG_4$ and the parity blocks $PB_1$ to $PB_4$, are zero padding blocks.

At S1050, the ECC encoder 241 of the ECC unit 240 may generate encoded data "Encoded Data" by adding second parity information to the data block matrix DBM when the parity blocks $PB_1$ to $PB_4$ are defined as first parity information. The encoded data "Encoded Data" may be generated by the second encoder (e.g., 241d of FIG. 3) of the ECC encoder 241. The second encoder 241d may generate the second parity information including a row parity and a column parity. The row parity includes M row parity blocks for the M rows of the data block matrix DBM, and the column parity includes N column parity blocks for the N columns of the data block matrix DBM. After that, the second encoder 241d may generate the encoded data "Encoded Data" by adding the generated row parity and column parity to the data block matrix DBM, as illustrated in FIG. 5.

Figure 11:
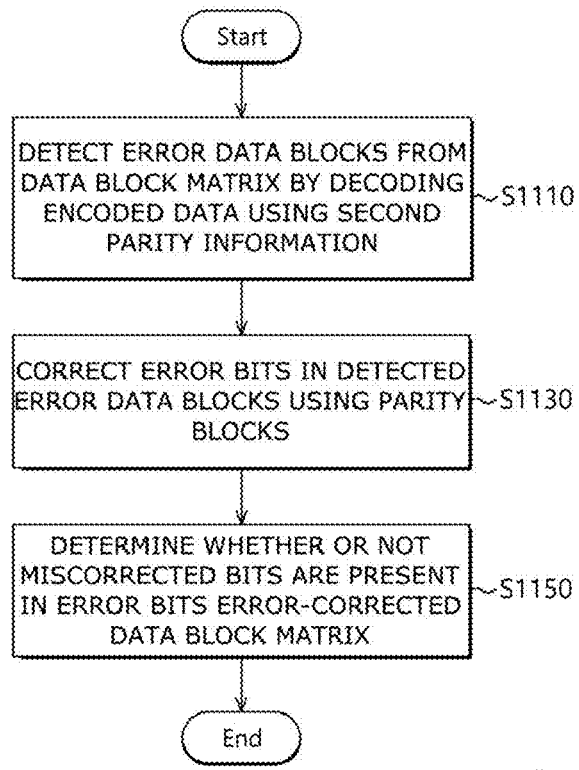
FIG. 11 is a flowchart illustrating a decoding method according to an embodiment of the present disclosure.

FIG. 11 is a flowchart illustrating a decoding method of an ECC unit according to an embodiment. The decoding method according to this embodiment will be described with reference to FIG. 11 together with FIGS. 1, 2, and 6 to 9D.

At S1110, the ECC decoder (e.g., 245 of FIG. 2) of the ECC unit 240 may detect one or more error data blocks in a data block matrix DBM by decoding encoded data "Encoded Data" using second parity information, for example, a row parity and a column parity. The error data blocks may be detected by the error detector (e.g., 245a of FIG. 6) of the ECC decoder 245.

At S1130, the ECC decoder 245 of the ECC unit 240 may correct error bits in the detected error data blocks using first parity information, e.g., the parity blocks $PB_1$ to $PB_4$. The error bits may be corrected by the error corrector (e.g., 245b of FIG. 6) of the ECC decoder 245.

It may be assumed that the detected error data blocks are the first error data block $EB_{31}$ and the second error data block $EB_{41}$ included in the different data block groups, for example, the third data block group $DBG_3$ and the fourth data block group $DBG_4$, as illustrated in FIG. 8A.

In an embodiment, the error corrector 245b may correct the error bits included in the first error data block $EB_{31}$ by overwriting bits of a first XOR block on bits of the first error data block $EB_{31}$. The first XOR block is obtained by performing XOR operations on respective bits of the remaining third data blocks $DB_3$ in the third data block group $DBG_3$ except the first error data block $EB_{31}$ and bits of the third parity block $PB_3$ corresponding to the third data block group $DBG_3$.

Similarly, the error corrector 245b may correct the error bits included in the second error data block $EB_{41}$ by overwriting bits of a second XOR block on bits of the second error data block $EB_{41}$. The second XOR block is obtained by performing XOR operations on respective bits of the remaining fourth data blocks $DB_4$ in the fourth data block group $DBG_4$ except the second error data block $EB_{41}$ and bits of the fourth parity block $PB_4$ corresponding to the fourth data block group $DBG_4$.

In another embodiment, the error corrector 245b may correct the error bits included in the first error data block $EB_{31}$ by performing XOR operations on bits of a third XOR block and the bits of the first error data block $EB_{31}$. The third XOR block is obtained by performing XOR operations on respective bits of all the third data blocks $DB_3$ of the third data block group $DBG_3$ including the first error data block $EB_{31}$ and the bits of the third parity block $PB_3$ corresponding to the third data block group $DBG_3$.

Similarly, the error corrector 245b may correct the error bits included in the second error data block $EB_{41}$ by performing XOR operations on bits of a fourth XOR block and the bits of the second error data block $EB_{41}$. The fourth XOR block is obtained by performing XOR operations on respective bits of all the fourth data blocks $DB_4$ of the fourth data block group $DBG_4$ including the second error data block $EB_{41}$ and the bits of the fourth parity block $PB_4$ corresponding to the fourth data block group $DBG_4$.

As illustrated in FIG. 9A, when the detected error blocks are the first error data block $EB_{31}$ and the second error data block $EB_{32}$ included in the same data block group (for example, the third data block group $DBG_3$), the error corrector 245b may first generate an XOR block (e.g., $SB_{33}$ of FIG. 9B) by performing XOR operations on respective bits of all the third data blocks $DB_3$ in the third data block group $DBG_3$ (which include the first and second error data blocks $EB_{31}$ and $EB_{32}$ in the third data block group $DBG_3$) and the bits of the third parity block $PB_3$. Next, the error corrector 245b may generate the first correction data block (e.g., $CB_{31}$ of FIG. 9C) by performing XOR operations on bits of the XOR block $SB_{33}$ and the bits of the first error data block $EB_{31}$. The error corrector 245b may perform decoding by sequentially inverting bits in positions corresponding to bits having a first value in the XOR block $SB_{33}$ among the bits of the first correction data block $CB_{31}$ and the bits of the second error data block $EB_{32}$ until the decoding becomes successful. Here, the first value may be 1.

At S1150, the ECC decoder 245 of the ECC unit 240 may determine whether or not data blocks including miscorrected bits are present in the error-corrected data block matrix. The determining of whether or not the data blocks including the miscorrected bits are present may be performed by the miscorrection determiner (e.g., 245c of FIG. 6) of the ECC decoder 245.

The miscorrection determiner 245c may determine whether or not the miscorrected bits are present using the data block groups $DBG_1$ to $DBG_4$ of the data block matrix DBM, of which error bits have been corrected by the error corrector 245b, and the parity blocks $PB_1$ to $PB_4$. For example, the miscorrection determiner 245c may perform XOR operations on the data block groups $DBG_1$ to $DBG_4$, of which error bits have been corrected, and the parity blocks $PB_1$ to $PB_4$. When all values of the XOR-operated results are zero (0), the miscorrection determiner 245c may determine that the miscorrected bits are not present in the error-corrected data block matrix. However, when one or more values of the XOR-operated results are 1, the miscorrection determiner 245c may determine that the miscorrected bits are present in the error-corrected data block matrix and may conclude that the decoding of the corresponding block matrix DBM has failed.

As described above with reference to FIGS. 4A and 4B, in embodiments of the present disclosure, the ECC encoder 241 generates a plurality of data block groups that are exclusive from each other based on data Data from an external apparatus, generates a plurality of parity blocks corresponding to the plurality of data block groups, and generates a data block matrix DBM by arranging the plurality of data block groups as well as the parity blocks in different diagonal lines of a data block matrix.

Therefore, compared to a prior device that uses one SPC block and thus can correct bit errors in one error data block, i.e., a (1, 1) error pattern, using the one SPC block, embodiments of the present disclosure can correct bit errors in more than one data block, e.g., a (2, 1) error pattern, by grouping data blocks into a plurality of data block groups and generating a plurality of SPC blocks respectively corresponding to the plurality of data block groups. That is, it is possible to correct a bigger error pattern than the (1, 1) error pattern of the prior device and thus reduce an error floor of the error correction process.

In addition, by arranging the plurality of data block groups in different diagonal lines, it is possible to uniformly spread data blocks in the data block groups in the data block matrix DBM, such that the efficiency of a block-based signal parity check for the data Data can be significantly increased.

Figure 12:
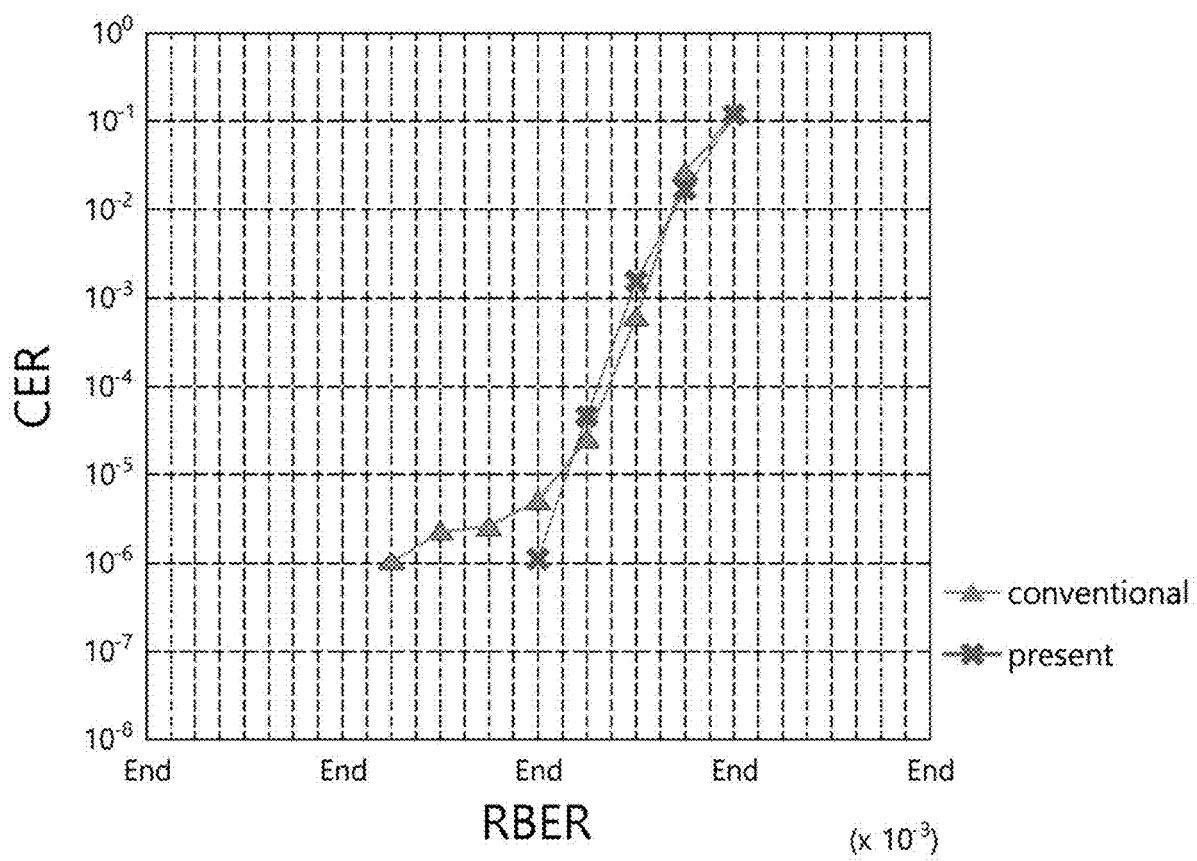
FIG. 12 is a graph illustrating a simulation result of an operation of the ECC unit according to an embodiment of the present disclosure.

FIG. 12 is a graph illustrating a simulation result of an operation according to an embodiment of the present disclosure. In FIG. 12, a horizontal axis of the simulation graph represents a raw bit error rate RBER and a vertical axis of the simulation graph represents a chunk error rate CER. The raw bit error rate RBER may represent a bit error rate according to a period of use of a nonvolatile memory device. The chunk error rate CER may be obtained by dividing the number of code words that are failed in decoding by the number of code words to be decoded. As shown in FIG. 12, when the ECC unit 240 according to the embodiment of the present disclosure is used, the error floor can be reduced.

Figure 13:
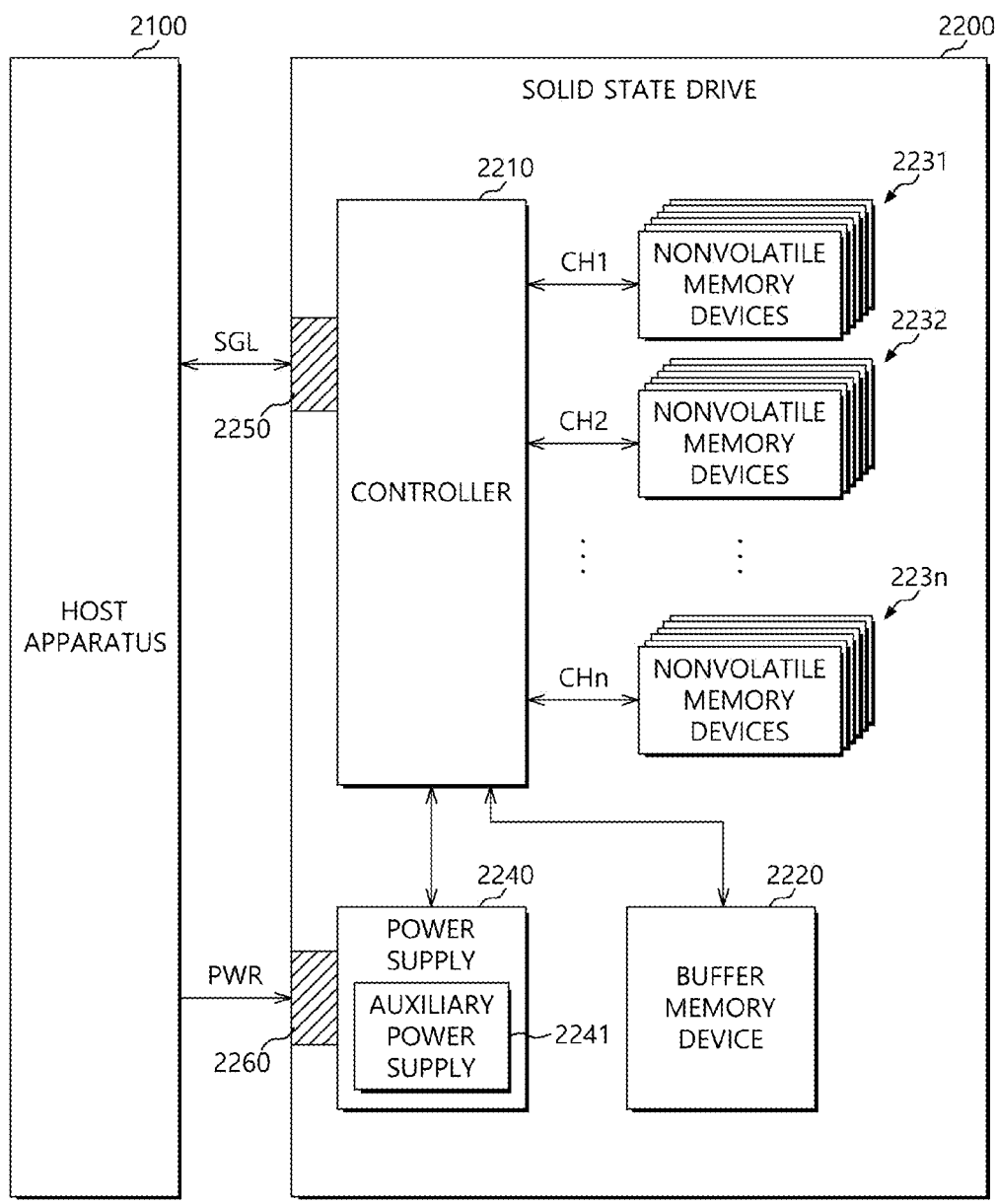
FIG. 13 is a diagram illustrating an example of a data processing system, including a solid state drive (SSD), according to an embodiment of the present disclosure.

FIG. 13 is a diagram illustrating an example of a data processing system 2000 according to an embodiment. Referring to FIG. 13, the data processing system 2000 may include a host apparatus 2100 and a solid state drive (SSD) 2200.

The SSD 2200 may include a controller 2210, a buffer memory device 2220, nonvolatile memory devices 2231 to 223n, a power supply 2240, a signal connector 2250, and a power connector 2260.

The controller 2210 may control an overall operation of the SSD 2220.

The buffer memory device 2220 may temporarily store data to be stored in the nonvolatile memory devices 2231 to 223n. The buffer memory device 2220 may temporarily store data read from the nonvolatile memory devices 2231 to 223n. The data temporarily stored in the buffer memory device 2220 may be transmitted to the host apparatus 2100 or the nonvolatile memory devices 2231 to 223n according to control of the controller 2210.

The nonvolatile memory devices 2231 to 223n may be used as a storage medium of the SSD 2200. The nonvolatile memory devices 2231 to 223n may be coupled to the controller 2210 through a plurality of channels CH1 to CHn. One or more nonvolatile memory devices may be coupled to one channel. The nonvolatile memory devices coupled to the one channel may be coupled to the same signal bus and the same data bus.

The power supply 2240 may provide power PWR input through the power connector 2260 to the inside of the SSD 2200. The power supply 2240 may include an auxiliary power supply 2241. The auxiliary power supply 2241 may supply the power PWR so that the SSD 2200 is normally terminated even when sudden power-off occurs. The auxiliary power supply 2241 may include large capacity capacitors capable of charging the power PWR.

The controller 2210 may exchange a signal SGL with the host apparatus 2100 through the signal connector 2250. The signal SGL may include a command, an address, data, and the like. The signal connector 2250 may include various types of connectors according to an interfacing method between the host apparatus 2100 and the SSD 2200.

Figure 14:
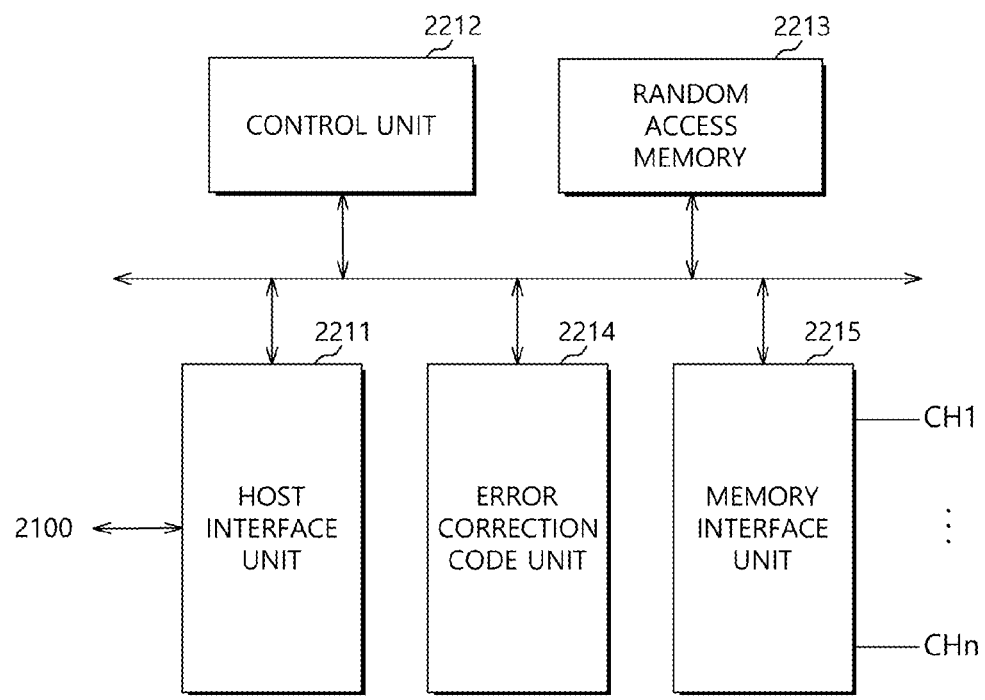
FIG. 14 is a diagram illustrating an example of a controller illustrated in FIG. 13 according to an embodiment of the present disclosure.

FIG. 14 is a diagram illustrating an example of the controller 2210 of FIG. 13 according to an embodiment. Referring to FIG. 14, the controller 2210 may include a host interface unit 2211, a control unit 2212, a random access memory (RAM) 2213, an error correction code (ECC) unit 2214, and a memory interface unit 2215.

The host interface unit 2211 may perform interfacing between the host apparatus 2100 and the SSD 2200 according to a protocol of the host apparatus 2100. For example, the host interface unit 2211 may communicate with the host apparatus 2100 through any one of a secure digital protocol, a universal serial bus (USB) protocol, a multimedia card (MMC) protocol, an embedded MMC (eMMC) protocol, a personal computer memory card international association (PCMCIA) protocol, a parallel advanced technology attachment (PATA) protocol, a serial advanced technology attachment (SATA) protocol, a small computer system interface (SCSI) protocol, a serial attached SCSI (SAS) protocol, a peripheral component interconnection (PCI) protocol, a PCI Express (PCI-E) protocol, and a universal flash storage (UFS) protocol. The host interface unit 2211 may perform a disc emulation function that the host apparatus 2100 recognizes the SSD 2200 as a general-purpose data storage apparatus, for example, a hard disc drive HDD.

The control unit 2212 may analyze and process the signal SGL input from the host apparatus 2100. The control unit 2212 may control operations of internal functional blocks according to firmware and/or software for driving the SDD 2200. The RAM 2213 may operate as a working memory for driving the firmware or software.

The ECC unit 2214 may generate parity information for data to be transferred to the nonvolatile memory devices 2231 to 223n of FIG. 13. The generated parity information may be stored in the nonvolatile memory devices 2231 to 223n together with the data. The ECC unit 2214 may detect errors in data read from the nonvolatile memory devices 2231 to 223n based on the parity information. When the detected errors are within a correctable range, the ECC unit 2214 may correct the detected errors.

The memory interface unit 2215 may provide a control signal, such as a command and an address, to the nonvolatile memory devices 2231 to 223n according to control of the control unit 2212. The memory interface unit 2215 may exchange data with the nonvolatile memory devices 2231 to 223n according to control of the control unit 2212. For example, the memory interface unit 2215 may provide data stored in the buffer memory device 2220 of FIG. 13 to the nonvolatile memory devices 2231 to 223n or provide data read from the nonvolatile memory devices 2231 to 223n to the buffer memory device 2220.

The embodiments of the present disclosure described with reference to FIGS. 2 to 11 are applicable to the ECC unit 2214 of FIG. 14.

Figure 15:
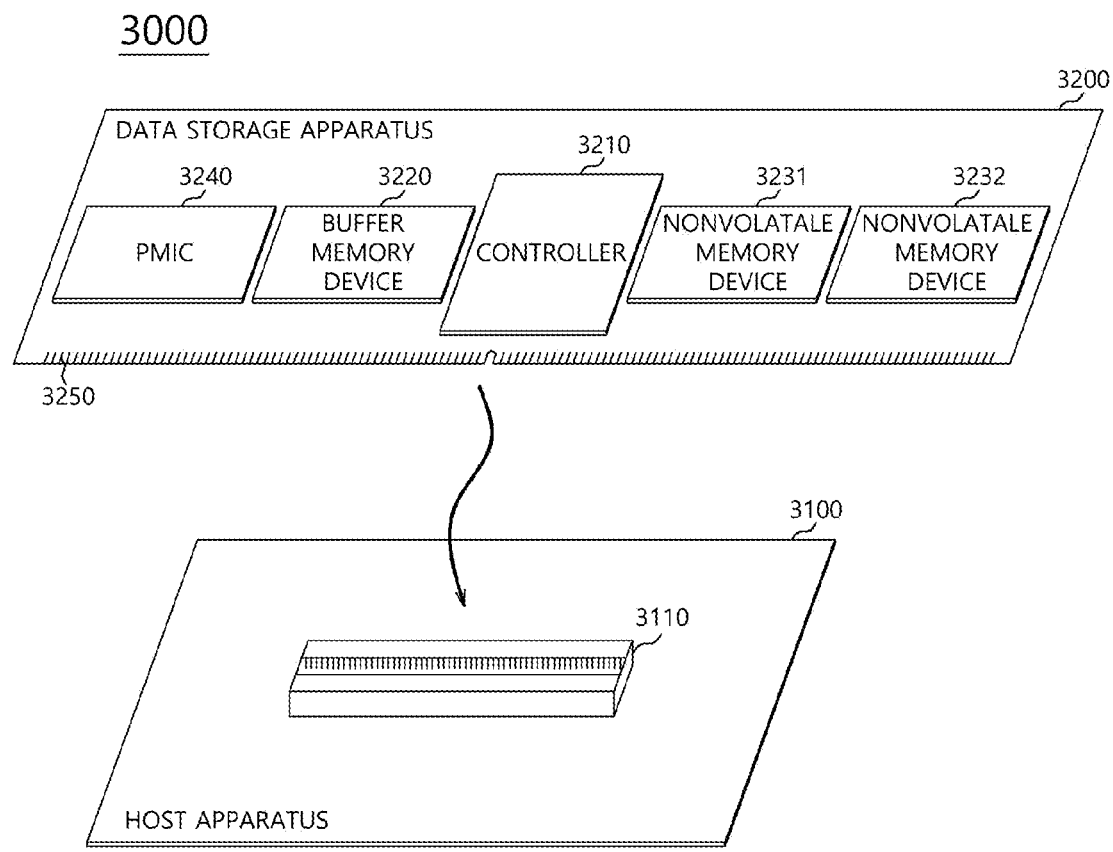
FIG. 15 is a diagram illustrating an example of a data processing system, including a data storage apparatus, according to an embodiment of the present disclosure.

FIG. 15 is a diagram illustrating an example of a data processing system 3000 according to an embodiment. Referring to FIG. 15, the data processing system 3000 may include a host apparatus 3100 and a data storage apparatus 3200.

The host apparatus 3100 may be configured in a board form such as a printed circuit board (PCB). Although not shown in FIG. 15, the host apparatus 3100 may include internal functional blocks configured to perform functions of the host apparatus 3100.

The host apparatus 3100 may include a connection terminal 3110 such as a socket, a slot, or a connector. The data storage apparatus 3200 may be mounted on the connection terminal 3110.

The data storage apparatus 3200 may be configured in a board form such as a PCB. The data storage apparatus 3200 may be referred to as a 'memory module' or a 'memory card.' The data storage apparatus 3200 may include a controller 3210, a buffer memory device 3220, nonvolatile memory devices 3231 to 3232, a power management integrated circuit (PMIC) 3240, and a connection terminal 3250.

The controller 3210 may control an overall operation of the data storage apparatus 3200. The controller 3210 may have the same configuration as the controller 2210 illustrated in FIG. 14. Therefore, the embodiments of the present disclosure described with reference to FIGS. 2 to 11 are applicable to the controller 3210.

The buffer memory device 3220 may temporarily store data to be stored in the nonvolatile memory devices 3231 and 3232. The buffer memory device 3220 may temporarily store data read from the nonvolatile memory devices 3231 and 3232. The data temporarily stored in the buffer memory device 3220 may be transmitted to the host apparatus 3100 or the nonvolatile memory devices 3231 and 3232 according to control of the controller 3210.

The nonvolatile memory devices 3231 and 3232 may be used as a storage medium of the data storage apparatus 3200.

The PMIC 3240 may provide power input through the connection terminal 3250 to the inside of the data storage apparatus 3200. The PMIC 3240 may manage the power of the data storage apparatus 3200 according to control of the controller 3210.

The connection terminal 3250 may be coupled to the connection terminal 3110 of the host apparatus 3100. Signals such as a command, an address, and data and power may be transmitted between the host apparatus 3100 and the data storage apparatus 3200 through the connection terminal 3250. The connection terminal 3250 may be configured in various forms according to an interfacing method between the host apparatus 3100 and the data storage apparatus 3200. The connection terminal 3250 may be arranged in any one side of the data storage apparatus 3200.

Figure 16:
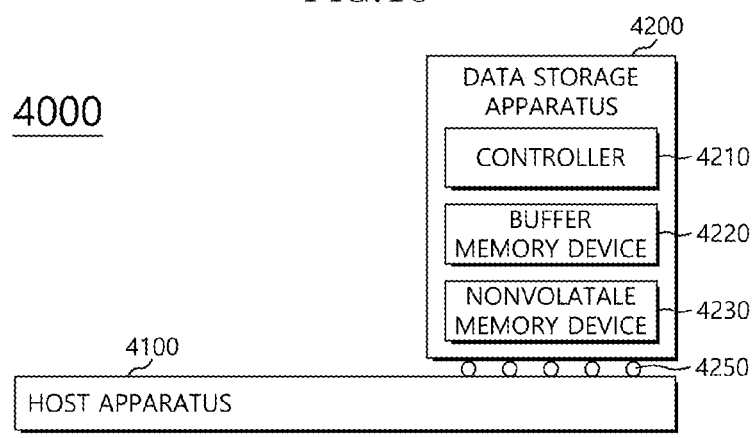
FIG. 16 is a diagram illustrating an example of a data processing system, including a data storage apparatus, according to an embodiment of the present disclosure.

FIG. 16 is a diagram illustrating an example of a data processing system, including a data storage apparatus 4000, according to an embodiment. Referring to FIG. 16, the data processing system 4000 may include a host apparatus 4100 and a data storage apparatus 4200.

The host apparatus 4100 may be configured in a board form such as a PCB. Although not shown in FIG. 16, the host apparatus 4100 may include internal functional blocks configured to perform functions of the host apparatus 4100.

The data storage apparatus 4200 may be configured in a surface mounting package form. The data storage apparatus 4200 may be mounted on the host apparatus 4100 through a solder ball 4250. The data storage apparatus 4200 may include a controller 4210, a buffer memory device 4220, and a nonvolatile memory device 4230.

The controller 4210 may control an overall operation of the data storage apparatus 4200. The controller 4210 may have the same configuration as the controller 2210 illustrated in FIG. 14. Therefore, the embodiments of the present disclosure described with reference to FIGS. 2 to 11 are applicable to the controller 4210.

The buffer memory device 4220 may temporarily store data to be stored in the nonvolatile memory device 4230. The buffer memory device 4220 may temporarily store data read from the nonvolatile memory device 4230. The data temporarily stored in the buffer memory device 4220 may be transmitted to the host apparatus 4100 or the nonvolatile memory device 4230 through control of the controller 4210.

The nonvolatile memory device 4230 may be used as a storage medium of the data storage apparatus 4200.

Figure 17:
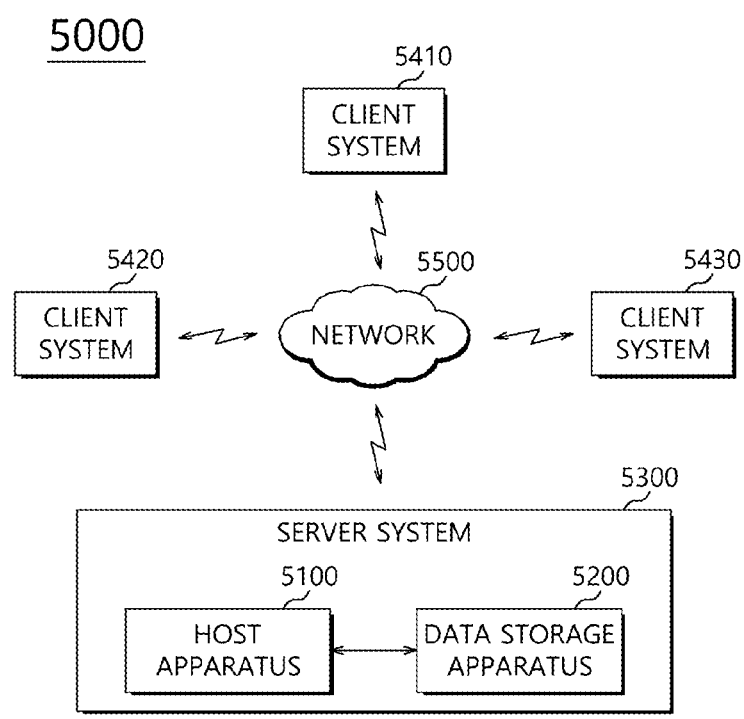
FIG. 17 is a diagram illustrating an example of a network system, including a data storage apparatus, according to an embodiment of the present disclosure.

FIG. 17 is a diagram illustrating an example of a network system 5000, including a data storage apparatus, according to an embodiment.

Referring to FIG. 17, the network system 5000 may include a server system 5300 and a plurality of client systems 5410 to 5430 which are coupled to the server system 5300 through a network 5500.

The server system 5300 may serve data in response to requests of the plurality of client systems 5410 to 5430. For example, the server system 5300 may store data provided from the plurality of client systems 5410 to 5430. In another example, the server system 5300 may provide data to the plurality of client systems 5410 to 5430.

The server system 5300 may include a host apparatus 5100 and a data storage apparatus 5200. The data storage apparatus 5200 may include the data storage apparatus 10 of FIG. 1, the data storage apparatus 2200 of FIG. 13, the data storage apparatus 3200 of FIG. 15, or the data storage apparatus 4200 of FIG. 16. Therefore, the embodiments of the present disclosure described with reference to FIGS. 2 to 11 are applicable to the data storage apparatus 5200.

Figure 18:
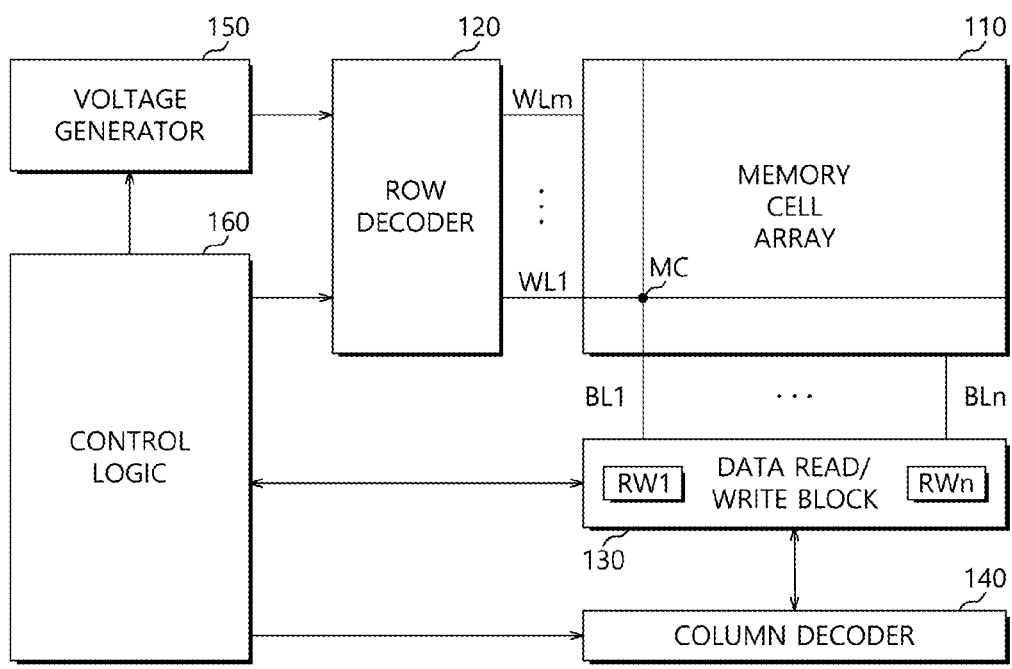
FIG. 18 is a block diagram illustrating an example of a nonvolatile memory device included in a data storage apparatus according to an embodiment of the present disclosure.

FIG. 18 is a block diagram illustrating an example of a nonvolatile memory device included in a data storage apparatus according to an embodiment. Referring to FIG. 18, a nonvolatile memory device 100 may include a memory cell array 110, a row decoder 120, a column decoder 140, a data read/write block 130, a voltage generator 150, and a control logic 160.

The memory cell array 110 may include a plurality of memory cells MCs disposed in intersection regions between word lines WL1 to WLm and bit lines BL1 to BLn and may be coupled between the word lines WL1 to WLm and the bit lines BL1 to BLn.

The row decoder 120 may be coupled to the memory cell array 110 through the word lines WL1 to WLm. The row decoder 120 may operate according to control of the control logic 160. The row decoder 120 may decode an address provided from an external apparatus (not shown). The row decoder 120 may select and drive the word lines WL1 to WLm based on a decoding result. For example, the row decoder 120 may provide a word line voltage provided from the voltage generator 150 to a selected one of the word lines WL1 to WLm.

The data read/write block 130 may be coupled to the memory cell array 110 through the bit lines BL1 to BLn. The data read/write block 130 may include read/write circuits RW1 to RWn corresponding to the bit lines BL1 to BLn, respectively. The data read/write block 130 may operate according to control of the control logic 160. The data read/write block 130 may operate as a write driver or a sense amplifier according to an operation mode. For example, the data read/write block 130 may operate as the write driver that is configured to store data provided from an external apparatus (not shown) in the memory cell array 110 in a write operation. In another example, the data read/write block 130 may operate as the sense amplifier that is configured to read data from the memory cell array 110 in a read operation.

The column decoder 140 may operate according to control of the control logic 160. The column decoder 140 may decode an address provided from an external apparatus (not shown). The column decoder 140 may couple the read/write circuits RW1 to RWn of the data read/write block 130 to data input/output (I/O) lines (or data I/O buffers) based on a decoding result.

The voltage generator 150 may generate voltages used for an internal operation of the nonvolatile memory device 100. The voltages generated by the voltage generator 150 may be applied to the memory cells MCs of the memory cell array 110. For example, a program voltage generated in a program (or write) operation may be applied to word lines of memory cells on which the program operation is to be performed. In another example, an erase voltage generated in an erase operation may be applied to well regions of memory cells on which the erase operation is to be performed. In another example, a read voltage generated in a read operation may be applied to word lines of memory cells on which the read operation is to be performed.

The control logic 160 may control an overall operation of the nonvolatile memory device 100 based on a control signal provided from an external apparatus (not shown). For example, the control logic 160 may control operations of the nonvolatile memory device 100 such as a read operation, a write operation, and an erase operation of the nonvolatile memory device 100.

The above described embodiments of the present disclosure are intended to illustrate and not to limit the present invention. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor device, comprising:
 a controller; and
 a memory device,
 wherein the controller comprises:
  a processor configured to process a request from an external apparatus;
  an interface configured to receive the request and data from the external apparatus; and
  an encoder configured to generate, in response to the request, a data block matrix including a plurality of data block groups and a plurality of parity blocks that are generated based on the received data, and to generate encoded data by adding parity information to the data block matrix, the encoded data being transmitted to the memory device,
 wherein the plurality of parity blocks respectively correspond to the data block groups, and
 wherein each of the plurality of data block groups comprises a multiplicity of data blocks, the data blocks included in each of the plurality of data block groups being arranged along a diagonal line of the data block matrix without overlapping the data blocks included in any of the other data block groups.

2. The semiconductor device of claim 1, wherein the encoder is configured to:
generate a plurality of data blocks based on the received data and generate the plurality of data block groups by grouping the plurality of data blocks;
generate the plurality of parity blocks respectively corresponding to the plurality of data block groups;
generate the data block matrix by arranging the plurality of data block groups and the plurality of parity blocks in a matrix form; and
generate the parity information and generate the encoded data by adding the parity information to the data block matrix.

3. The semiconductor device of claim 1,
wherein each of the multiplicity of data blocks includes one or more bits.

4. The semiconductor device of claim 1, wherein each of the parity blocks is used to perform a single parity check (SPC) on a corresponding one of the data block groups.

5. The semiconductor device of claim 1, wherein the data block matrix includes M rows and N columns, M and N being natural numbers.

6. The semiconductor device of claim 5, wherein the encoder arranges the plurality of parity blocks in one of the M rows or one of the N columns.

7. The semiconductor device of claim 5, wherein the encoder determines data block groups to be arranged in block positions in the data block matrix using row numbers of the M rows, column numbers of the N columns, and a number of the parity blocks, each block position being indicated by a row number and a column number.

8. The semiconductor device of claim 5, wherein the parity information includes:
a row parity including M row parity blocks for the M rows of the data block matrix; and
a column parity including N column parity blocks for the N columns of the data block matrix.

9. The semiconductor device of claim 1, wherein, when the encoded data is first encoded data and the data block matrix is a first data block matrix, the semiconductor device further comprises:
a decoder configured to detect one or more error data blocks in a second data block matrix by decoding second encoded data from the memory device and to correct error bits in the detected error data blocks using parity blocks in the second data matrix.

10. The semiconductor device of claim 9, wherein the decoder includes:
an error detector configured to detect the one or more error data blocks by decoding the second encoded data using parity information included in the second encoded data; and
an error corrector configured to correct the error bits in the detected error data blocks using a data block group and a parity block that correspond to each of the detected error data blocks, the corresponding data block group and the corresponding parity block being included in the second data block matrix.

11. The semiconductor device of claim 10, wherein when the detected error data blocks include a first error data block and a second error data block that are respectively included in a first data block group and a second data block group, the error corrector corrects error bits in the first error data block by overwriting bits of a first XOR block on bits of the first error data block and corrects error bits in the second error data block by overwriting bits of a second XOR block on bits of the second error data block, the second data block group being different from the first data block group, and
wherein the first XOR block is obtained by performing XOR operations on each bit of a first parity block and respective bits of other data blocks in the first data block group, and the second XOR block is obtained by performing XOR operations on each bit of a second parity block and respective bits of other data blocks in the second data block group, the other data blocks in the first data block group excluding the first error data block and the first parity block corresponding to the first data block group, the other data blocks in the second data block group excluding the second error data block and the second parity block corresponding to the second data block group.

12. The semiconductor device of claim 10, wherein when the detected error data blocks include a first error data block and a second error data block that are respectively included in a first data block group and a second data block group different from the first data block group, the error corrector corrects error bits in the first error data block by performing XOR operations on bits of a first XOR block and bits of the first error data block and corrects error bits in the second error data block by performing XOR operations on bits of a second XOR block and bits of the second error data block, and
wherein the first XOR block is obtained by performing XOR operations on bits of all data blocks in the first data block group including the first error data block and bits of a first parity block corresponding to the first data block group, and the second XOR block is obtained by performing XOR operations on bits all data blocks in the second data block group including the second error data block and bits of a second parity block corresponding to the second data block group.

13. The semiconductor device of claim 10, wherein when the detected error data blocks include a first error data block and a second error data block included in a first data block group, the error corrector generates an XOR block by performing XOR operations on bits of all data blocks in the first data block group including the first and second error data blocks and bits of a first parity block corresponding to the first data block group, generates a first correction data block by performing XOR operations on the bits in the first error data block and bits of the XOR block, and performing a decoding operation by sequentially inverting bits of the first correction data block and bits of the second error data block that correspond to bits having a first value in the XOR block.

14. The semiconductor device of claim 10, wherein the decoder further includes a miscorrection determiner for performing XOR operations on a plurality of data block groups and a plurality of parity blocks respectively corresponding to the plurality of data block groups in the error-corrected second data block matrix and determining whether or not a data block including miscorrected bits is present in the error-corrected second data block matrix based on XOR-operated values.

15. An encoding method of a semiconductor device, the method comprising:
generating a plurality of data block groups and a plurality of parity blocks respectively corresponding to the data block groups based on data received from an external apparatus;
generating a data block matrix by arranging the data block groups and the parity blocks in a matrix form; and generating encoded data by adding parity information to the data block matrix, wherein each of the plurality of data block groups comprises a multiplicity of data blocks, the data blocks included in each of the plurality of data block groups being arranged along a diagonal line of the data block matrix without overlapping the data blocks included in any of the other data block groups.

16. The method of claim 15, wherein the data block matrix includes M rows and N columns, M and N being natural numbers, wherein the generating of the data block matrix includes:
arranging the parity blocks in one of the M rows or one of the N columns; and
arranging the data block groups by determining data block groups to be arranged in block positions in the data block matrix using row numbers of the M rows, column numbers of the N columns, and a number of the parity blocks, each block position being indicated by a row number and a column number, and wherein the generating of the encoded data includes:
generating the parity information which includes a row parity including M row parity blocks for the M rows and a column parity including N column parity blocks for the N columns; and
adding the row parity and the column parity to the data block matrix.

17. A decoding method of a semiconductor device, the method comprising:

detecting one or more error data blocks in a data block matrix that includes a plurality of data block groups and a plurality of parity blocks by decoding encoded data using parity information included in the encoded data; and correcting error bits in the detected error data blocks using the parity blocks, wherein the plurality of parity blocks respectively correspond to the data block groups, and wherein each of the plurality of data block groups comprises a multiplicity of data blocks, the data blocks included in each of the plurality of data block groups being arranged along a diagonal line of the data block matrix without overlapping the data blocks included in any of the other data block groups.

18. The method of claim 17, wherein when the detected error data blocks include a first error data block and a second error data block that are respectively included in a first data block group and a second data block group, the second data block group being different from the first data block group, the correcting of the error bits in the detected error data blocks includes:

overwriting bits of a first XOR block on bits of the first error data block, the first XOR block being obtained by performing XOR operations on each bit of a first parity block and respective bits of other data blocks in the first data block group, the other data blocks in the first data block group excluding the first error data block and the first parity block corresponding to the first data block group; and overwriting bits of a second XOR block on bits of the second error data block, the second XOR block being obtained by performing XOR operations on each bit of a second parity block and respective bits of other data blocks in the second data block group, the other data blocks in the second data block group excluding the second error data block and the second parity block corresponding to the second data block group.

19. The method of claim 18, wherein when the detected error data blocks include a first error data block and a second error data block that are included in a first data block group, the correcting of the error bits in the detected error data blocks includes:

generating an XOR block by performing XOR operations on bits of all data blocks in the first data block group including the first and second error data blocks and bits of a first parity block corresponding to the first data block group;

generating a first correction data block by performing XOR operations on bits in the first error data block and bits of the XOR block; and performing a decoding operation by sequentially inverting bits of the first correction data block and bits of the second error data block that correspond to bits having a first value in the XOR block.

20. The method of claim 17, after the correcting of the error bits in the detected error data blocks, further comprising:

performing XOR operations on the plurality of data block groups and the plurality of parity blocks corresponding to the data block groups in the error-corrected data block matrix; and determining whether or not a data block including miscorrected bits is presented in the error-corrected data block matrix based on an XOR operation result.

* * * * *